(12) United States Patent
Kawauchi

(10) Patent No.: US 7,851,132 B2
(45) Date of Patent: Dec. 14, 2010

(54) PHOTOPOLYMERIZATION TYPE PHOTOSENSITIVE LITHOGRAPHIC PRINTING PLATE PRECURSOR

(75) Inventor: Ikuo Kawauchi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 165 days.

(21) Appl. No.: 11/863,855

(22) Filed: Sep. 28, 2007

(65) Prior Publication Data

US 2008/0081291 A1    Apr. 3, 2008

(30) Foreign Application Priority Data

Sep. 29, 2006    (JP)    ............... 2006-268603

(51) Int. Cl.
  *G03F 7/028*    (2006.01)
  *B41N 1/14*    (2006.01)
(52) U.S. Cl. .................. 430/281.1; 430/302; 430/273.1
(58) Field of Classification Search ....................... None
  See application file for complete search history.

(56) References Cited

U.S. PATENT DOCUMENTS

| | | | | |
|---|---|---|---|---|
| 4,173,673 A * | 11/1979 | Bratt et al. | .................. | 428/217 |
| 4,284,710 A * | 8/1981 | Burg | ........................ | 430/271.1 |
| 4,705,745 A * | 11/1987 | Kitchin et al. | .............. | 430/505 |
| 5,474,875 A * | 12/1995 | Loerzer et al. | ........... | 430/281.1 |
| 6,420,089 B1 * | 7/2002 | Baumann et al. | ......... | 430/273.1 |
| 7,213,516 B1 * | 5/2007 | Teng | ........................... | 101/451 |
| 2001/0003032 A1 * | 6/2001 | Harada et al. | ............... | 430/302 |
| 2001/0049073 A1 | 12/2001 | Hada et al. | | |
| 2007/0048663 A1 * | 3/2007 | Sakata | ..................... | 430/270.1 |

FOREIGN PATENT DOCUMENTS

| | | | |
|---|---|---|---|
| EP | 1 693 706 A2 | 8/2003 | |
| EP | 1 356 927 A2 | 10/2003 | |
| EP | 1 705 522 A2 | 9/2006 | |
| EP | 1 762 894 A1 | 3/2007 | |
| JP | 6-27665 A | 2/1994 | |
| JP | 2003-43703 A | 2/2003 | |
| WO | 2005/111727 A1 | 11/2005 | |

OTHER PUBLICATIONS

English translation of JP, 06-027665, A (1994) from machine translation from AIPN Japan Patent Office National Center for Industrial Property Information and Training, generated Jul. 9. 2009, 7 pages.*
English translation of JP, 2003-43703, A (2003) from machine translation from AIPN Japan Patent Office National Center for Industrial Property Information and Training, generated Jul. 9. 2009, 28 pages.*
Reusch, William, "Organic Chemistry On Line", Spectroscopy, 4 pages, and Visible and Ultraviolet Spectroscopy , 8 pages. at http://www.cem.msu.edu/~reuch/VirtualText/Spectrpy/spectro.htm and http://www.cem.msu.edu/~reuch/VirtualText/Spectrpy/UV-Vis/spectrum.htm last modified Aug. 10, 2007.*
Scott Prahl, "Malachite Green", Internet Article, http://web.archive.org/web/20060911220252/http://omlc.bme.ogi.edu/spectra/PhotochemCAD/html/malachiteGreen.html, Sep. 11, 2006, retrieved on Nov. 16, 2007.
Masao Tanaka, "Phthalocyanines—High Performance Pigments with New Applications", High Performance Pigments, May 7, 2003, pp. 263-278, http://www3.interscience.wiley.com/cgi-bin/booktext/104530889/BOOKPDFSTART, retrieved on May 7, 2003, Wiley-VCH Verlag GmbH & Co.

* cited by examiner

*Primary Examiner*—Cynthia Hamilton
(74) *Attorney, Agent, or Firm*—Sughrue Mion, PLLC

(57) ABSTRACT

A negative-working photopolymerization type photosensitive lithographic printing plate precursor for exposing with laser, includes: a hydrophilic support; at least one photopolymerizable photosensitive layer; and a protective layer, provided in this order, wherein the photopolymerizable photosensitive layer contains a sensitizing dye, a dye or pigment capable of absorbing light having a wavelength of a laser emission wavelength ±50 nm, which is different from the sensitizing dye; and a photopolymerization initiator.

7 Claims, No Drawings

PHOTOPOLYMERIZATION TYPE PHOTOSENSITIVE LITHOGRAPHIC PRINTING PLATE PRECURSOR

FIELD OF THE INVENTION

The present invention relates to a photopolymerization type photosensitive lithographic printing plate precursor, and more particularly to a photopolymerization type photosensitive lithographic printing plate precursor suitable for conducting drawing with a laser beam and suitable for high definition AM screen printing of screen line number of 200 or more or FM screen printing.

BACKGROUND OF THE INVENTION

Heretofore, a lithographic printing plate precursor comprises a photosensitive resin layer provided on a support having a hydrophilic surface. As for the plate-making method thereof, the lithographic printing plate precursor is ordinarily subjected to floodwise exposure (mask exposure) via a lith film and then removal of the non-image area with a developer to obtain a desired printing plate. However, with the recent progress of digitized techniques, a computer-to-plate (CTP) technique of directly conducting exposure process on the surface of the lithographic printing plate precursor by scanning according to digitized image data with highly convergent light, for example, a laser beam, without using a lith film has been developed. Photosensitive lithographic printing plate precursors adapted for the technique have also been developed.

As the photosensitive lithographic printing plate precursor suitable for exposure with a laser beam, a photosensitive lithographic printing plate precursor having a polymerizable photosensitive layer is exemplified. Such a photosensitive lithographic printing plate precursor is preferable because the polymerizable photosensitive layer is easily enable to increase sensitivity by appropriately selecting a photopolymerization initiator or a photopolymerization initiation system (hereinafter also simply referred to as an "initiator" and an "initiation system", respectively) in comparison with other conventional photosensitive layers.

However, when an image is drawn on such a photosensitive lithographic printing plate precursor with a laser beam, a region of insufficient polymerization is formed in the edge of image due to an inadequate exposure amount depending on an energy distribution profile of the laser beam. Thus, sharpness of the edge of image is impaired, resulting in decrease in resolution. Also, in the region of insufficient polymerization formed in the edge of image, defect of removal occurs depending on alkali concentration of a developer or condition of a developing brush in a development processing step to cause a large variation of halftone dot area in a printing plate formed.

Moreover, since such a lithographic printing plate precursor comprises a support having a roughened surface according to electrolytic treatment or brush treatment in order to ensure hydrophilicity, image quality and sharpness are additionally injured and reproducibility in the shadow area is severely degraded due to scattering of reflection light at the laser exposure.

On the other hand, requirements for the high definition AM screen printing or FM screen printing have recently increased in the field of CTP technique. Therefore, the resolution of lithographic printing plate precursor becomes an important performance.

The FM (Frequency Modulation) screen comprises fine halftone dots of approximately 20 microns irregularly arranged irrespective of screen angle and line number and expresses density gradation by halftone dot density per unit area. The features of FM screen print are that interference moire and rosette pattern do not occur, that tone jump in a halftone area of approximately 50% is avoided, and that due to the small size of halftone dot, overlap of halftone dots decreases so that the color reproduced can be brilliantly seen.

In contrast to the FM screen, the AM (Amplitude Modulation) screen comprises fine halftone dots regularly arranged at a certain angle and expresses density gradation by halftone dot size per unit area. In Japan, a line number of the AM screen is ordinarily 175 lines per inch. On the other hand, printing using a screen line number of 200 or more is defined as the high definition AM screen printing.

The characteristics of high definition print include decreases in the moire and rosette pattern, improvement in texture of image and improvements in feeling of reality and reproducibility of detail.

However, lithographic printing plate precursors accompanying the degradation of reproducibility in the shadow area, for example, the lithographic printing plate precursors having the polymerizable photosensitive layer described above are difficult to use for the purpose of providing printing plates suitable for the FM screen printing or high definition AM screen printing, because they cannot reproduce extremely fine halftone dots.

In JP-A-2003-43703 (the term "JP-A" as used herein means an "unexamined published Japanese patent application"), a photosensitive lithographic printing plate comprising a support having provided thereon an intermediate layer containing a polymer compound including a constituent unit having a sulfonic acid group in its side chain and a polymerizable photosensitive layer in order is described. However, the photosensitive lithographic printing plate is still insufficient for a printing plate precursor suitable for the high definition AM screen printing or FM screen printing. Particularly, since unevenness of halftone dot with the FM screen is severe, it is difficult to use the FM screen. Further, the photosensitive lithographic printing plate is insufficient for preservation stability.

SUMMARY OF THE INVENTION

An object of the present invention is to provide a photopolymerization type photosensitive lithographic printing plate precursor, which is suitable for conducting drawing with a laser beam and suitable for high definition AM screen printing of screen line number of 200 or more or FM screen printing, and particularly, which is excellent in uniformity of halftone dot in the halftone area in case of using the FM screen.

As a result of intensive investigations, the inventor has found that the above-described object can be achieved by the constitution described below.

Specifically, the present invention includes the following items.

(1) A negative-working photopolymerization type photosensitive lithographic printing plate precursor for exposing with laser, comprising: a hydrophilic support; at least one photopolymerizable photosensitive layer; and a protective layer in this order, wherein the photopolymerizable photosensitive layer contains (a) a sensitizing dye, (b) a dye or pigment capable of absorbing light having a wavelength of a laser emission wavelength ±50 nm, which is different from the sensitizing dye, and (c) a photopolymerization initiator.

(2) The negative-working photopolymerization type photosensitive lithographic printing plate precursor as described in (1) above, wherein the laser is a laser of blue to ultraviolet region emitting light of 350 to 450 nm.

(3) The negative-working photopolymerization type photosensitive lithographic printing plate precursor as described in (1) or (2) above, wherein the photosensitive layer contains (i), (ii), (iii), (iv) and (v) shown below:
(i) a sensitizing dye having an absorption maximum in a wavelength range of 350 to 450 nm,
(ii) a photopolymerization initiator,
(iii) an addition polymerizable compound having an ethylenically unsaturated double bond,
(iv) a dye or pigment capable of absorbing light having a wavelength of a laser emission wavelength ±50 nm,
(v) a binder polymer which is a polymer comprising at least one repeating unit represented by the following formula (1):

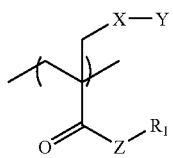

(1)

wherein X represents an oxygen atom, a sulfur atom or a —NH— group, Y represents a hydrogen atom, an alkyl group having from 1 to 12 carbon atoms, a cyclic alkyl group having from 5 to 12 carbon atoms or a group including an aromatic ring having from 6 to 20 carbon atoms, Z represents an oxygen atom, a sulfur atom or a —NH— group, and $R_1$ represents an alkyl group having from 1 to 18 carbon atoms, an alkyl group including an alicyclic structure having from 5 to 20 carbon atoms or a group containing aromatic ring having from 6 to 20 carbon atoms.

(4) The negative-working photopolymerization type photosensitive lithographic printing plate precursor as described in (3) above, wherein the photopolymerization initiator of (ii) is a hexaarylbisimidazole compound and the photosensitive layer further contains a sulfur-containing compound represented by the following formula (2) or (3):

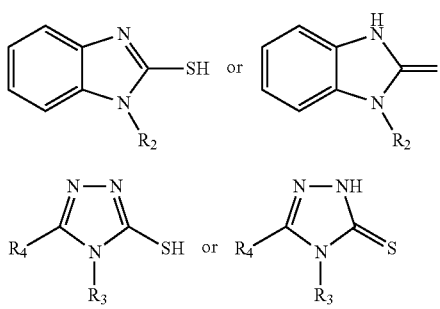

wherein $R_2$, $R_3$ and $R_4$ each independently represents a hydrogen atom, a substituted or unsubstituted, straight-chain or branched alkyl group having from 1 to 18 carbon atoms, a substituted or unsubstituted cyclic alkyl group having from 5 to 20 carbon atoms or an aromatic group.

According to the present invention, a photopolymerization type photosensitive lithographic printing plate precursor can be provided, which is suitable for conducting drawing with a laser beam and suitable for high definition AM screen printing of screen line number of 200 or more or FM screen printing, particularly, which is excellent in uniformity of halftone dot in the halftone area in case of using the FM screen.

DETAILED DESCRIPTION OF THE INVENTION

[Photopolymerization Type Photosensitive Lithographic Printing Plate Precursor]

With respect to the photopolymerization type photosensitive lithographic printing plate precursor according to the invention, the constitutions thereof will be described in order below.

[Support]

First, a support for use in the photopolymerization type photosensitive lithographic printing plate according to the invention is described below.

As for the support used in the invention, although any support having a hydrophilic surface can be employed, it is preferably a dimensionally stable plate-like material, for example, paper, paper laminated with plastic (for example, polyethylene, polypropylene or polystyrene), a plate of metal (for example, aluminum, zinc or copper) or alloy (for example, alloy of aluminum with silicon, copper, magnesium, chromium, zinc, lead, bismuth or nickel), a film of plastic (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal) and paper or a plastic film having laminated with or vapor-deposited thereon the above-described metal or alloy. Among these supports, the aluminum plate is particularly preferred, because it is extremely dimensional stable and relatively inexpensive. Also, a composite sheet comprising a polyethylene terephthalate film having bonded thereon an aluminum sheet described in JP-B-48-18327 (the term "JP-B" as used herein means an "examined published Japanese patent publication") is preferred. The thickness of the support is approximately from 0.05 to 1 mm.

In the case of using a support having a metal surface, particularly an aluminum surface, it is preferred that the support is subjected to surface treatment, for example, graining treatment, immersion treatment in an aqueous solution of sodium silicate, potassium fluorozirconate, a phosphate or the like, or anodizing treatment, described below.

[Graining Treatment]

A method for the graining treatment includes mechanical graining, chemical graining and electrolytic graining, as described in JP-A-56-28893. Specifically, there may be employed an electrochemically graining method of electrochemically graining the surface in an electrolytic solution of hydrochloric acid or nitric acid and a mechanical graining method, for example, a wire brush graining method of scratching the aluminum surface with a metal wire, a ball graining method of graining the aluminum surface with grinding balls and an abrasive and a brush graining method of graining the aluminum surface with a nylon brush and an abrasive. The graining methods may be employed individually or in combination thereof.

Of the methods, the electrochemical method of chemically graining the surface in an electrolytic solution of hydrochloric acid or nitric acid is a surface roughening method suitably used in the invention, and suitable current density is in a range of 100 to 400 C/dm$^2$. More specifically, it is preferred to conduct electrolysis in an electrolytic solution containing from 0.1 to 50% by weight hydrochloric acid or nitric acid under the conditions from 20 to 100° C. in temperature, from 1 second to 30 minutes in time and from 100 to 400 C/dm$^2$ in current density.

The aluminum support subjected to the graining treatment is then chemically etched with an acid or an alkali. The method of using an acid as an etching agent takes time for destroying fine structures and thus, it is disadvantageous to industrially apply the method to the invention. Such disadvantage can be overcome by using an alkali as the etching agent.

Examples of the alkali agent preferably used in the invention include sodium hydroxide, sodium carbonate, sodium aluminate, sodium metasilicate, sodium phosphate, potassium hydroxide and lithium hydroxide. Preferable ranges of concentration and temperature are form 1 to 50% by weight and from 20 to 100° C., respectively. The alkali etching is preferably performed so that a dissolution amount of aluminum is in a range of 5 to 20 g/m$^3$.

After the etching procedure, the support is subjected to washing with an acid for removing stain (smut) remaining on the surface thereof. Examples of the acid for use in the acid-washing step include nitric acid, sulfuric acid, phosphoric acid, chromic acid, hydrofluoric acid and borohydrofluoric acid. In particular, as the method for removing smut after the electrochemical graining treatment, a method of bringing the aluminum support into contact with a 15 to 65% by weight aqueous solution of sulfuric acid having a temperature of 50 to 90° C. as described in JP-A-53-12739 and a method of performing alkali etching as described in JP-B-48-28123 are preferably exemplified.

In the invention, surface roughness (Ra) of the aluminum support is preferably from 0.3 to 0.7 µm.

[Anodizing Treatment]

The aluminum support thus-treated may be then subjected to anodizing treatment. The anodizing treatment can be conducted in a manner conventionally used in the field of art.

Specifically, it is performed by applying a direct current or alternating current to the aluminum support in an aqueous solution or non-aqueous solution containing sulfuric acid, phosphoric acid, chromic acid, oxalic acid, sulfamic acid, benzenesulfonic acid or a combination of two or more thereof to form an anodic oxide layer on the surface of aluminum support.

The conditions of anodizing treatment cannot be determined in a general way, since they are widely varied depending on the electrolytic solution to be used. Ordinarily, however, a concentration of the electrolytic solution is in a range of 1 to 80%, a temperature of the electrolytic solution is in a range of 5 to 70° C., a current density is in a range of 0.5 to 60 ampere/dm$^2$, a voltage is in a range of 1 to 100 V, and a period of electrolysis is in a range of 10 to 100 seconds.

Of the anodizing treatments, a method of anodizing in a sulfuric acid solution with a high current density as described in British Patent 1,412,768 and a method of anodizing using phosphoric acid as an electrolytic bath as described in U.S. Pat. No. 3,511,661 are preferably used.

In the invention, the amount of anodic oxide layer is preferably from 1 to 10 g/m$^2$. When the amount is less than 1 g/m$^2$, scratch may be apt to occur in the plate. The amount exceeding 10 g/m$^2$ is disadvantageous from an economical standpoint because a large amount of electricity is necessary. The amount of anodic oxide layer is more preferably from 1.5 to 7 g/m$^2$, and still more preferably from 2 to 5 g/m$^2$.

In the invention, the aluminum support may further be subjected to sealing treatment after the graining treatment and anodizing treatment. The sealing treatment is performed by immersing the aluminum support in hot water or a hot aqueous solution containing an inorganic salt or an organic salt, or transporting the aluminum support in a water vapor bath. Moreover, the aluminum support for use in the invention may be subjected to surface treatment other than silicate treatment with an alkali metal silicate, for example, immersion treatment in an aqueous solution, for example, of potassium fluorozirconate or a phosphate.

According to the invention, to a support (in case of using an aluminum support, the aluminum support appropriately subjected to the above-described surface treatments is preferred), a photopolymerizable photosensitive layer comprising, for example, a photopolymerization type photosensitive composition is applied and then a protective layer is applied to prepare a photopolymerization type photosensitive lithographic printing plate precursor. Before the application of the photopolymerizable photosensitive layer, if desired, an organic or inorganic undercoat layer may be provided on the support, or the support may be subjected to a sol-gel treatment wherein a covalent bond of a functional group capable of generating an addition reaction by a radical is formed as described in JP-A-7-159983.

A substance for forming the organic undercoat layer includes, for example, a water-soluble resin, e.g., polyvinylphosphonic acid, a polymer or copolymer having a sulfonic acid group in the side chain thereof, polyacrylic acid, a water-soluble metal salt (e.g., zinc borate), a yellow dye and an amine salt.

More specifically, examples of the organic compound for use in the organic undercoat layer include carboxymethyl cellulose, dextrin, gum arabic, a phosphonic acid having an amino group (for example, 2-aminoethylphosphonic acid), an organic phosphonic acid (for example, phenylphosphonic acid, naphthylphosphonic acid, alkylphosphonic acid, glycerophosphonic acid, methylenediphosphonic acid or ethylenediphosphonic acid, each of which may have a substituent), an organic phosphoric acid (for example, phenylphosphoric acid, naphthylphosphoric acid, alkylphosphoric acid or glycerophosphoric acid, each of which may have a substituent), an organic phosphinic acid (for example, phenylphosphinic acid, naphthylphosphinic acid, alkylphosphinic acid or glycerophosphinic acid, each of which may have a substituent), an amino acid (for example, glycine or β-alanine), and a hydrochloride of an amine containing a hydroxy group (for example, triethanolamine hydrochloride). The organic compounds may be used individually or as a mixture of two or more thereof.

The organic undercoat layer can be provided in the following manner. Specifically, the organic compound as described above is dissolved in water, an organic solvent, for example, methanol, ethanol or methyl ethyl ketone, or a mixture thereof, the solution thus prepared is applied to the support and dried to form the organic undercoat layer. Alternatively, the organic compound as described above is dissolved in water, an organic solvent, for example, methanol, ethanol or methyl ethyl ketone, or a mixture thereof, and the support is immersed in the solution thus prepared to adsorb the organic compound on the surface of support, then washed, for example, with water and dried to form the organic undercoat layer. In the former method, the solution containing the organic compound in concentration of 0.005 to 10% by weight is coated by means of various methods. Any method, for example, bar coater coating, spin coating, spray coating or curtain coating can be employed. In the latter method, the concentration of the organic compound in the solution is preferably from 0.01 to 20% by weight, and more preferably from 0.05 to 5% by weight. The immersion temperature is preferably from 20 to 90° C., and more preferably from 25 to 50° C. The immersion time is preferably from 0.1 second to 20 minutes, and more preferably from 2 seconds to one minute.

The solution of organic compound may be used by adjusting the pH thereof in a range of 1 to 12 with a basic substance, for example, ammonia, triethylamine or potassium hydroxide, or an acidic substance, for example, hydrochloric acid or phosphoric acid. Further, a yellow dye may be added to the solution in order to improve tone reproducibility of the photopolymerization type photosensitive lithographic printing plate precursor.

The coating amount of the organic undercoat layer after drying is preferably from 2 to 200 mg/m$^2$, and more preferably from 5 to 100 mg/m$^2$. When the coating amount is less than 2 mg/m$^2$, sufficient printing durability is not achieved. On the other hand, when the coating amount is more than 200 mg/m$^2$, sufficient printing durability is also not achieved.

A substance for use in the inorganic undercoat layer includes an inorganic salt, for example, cobalt acetate, nickel acetate or potassium fluorotitanate. The method for the formation of the inorganic undercoat layer is same as that of the organic undercoat layer described above.

[Photosensitive Layer]

[Sensitizing Dye]

The sensitizing dye for use in the photopolymerization type photosensitive lithographic printing plate precursor according to the invention is a dye capable of transmitting energy of laser beam absorbed to a photopolymerization initiator through energy transfer or electron transfer.

As far as the sensitizing dye has the above-described function, the adsorption wavelength thereof is not particularly restricted and it is appropriately determined depending on a wavelength of laser used for the exposure. According to the invention, the sensitizing dye having an absorption maximum in a wavelength range of 350 to 450 nm is preferably used. Examples of the sensitizing dye include merocyanine dyes represented by formula (2) shown below, benzopyranes or coumarins represented by formula (3) shown below, aromatic ketones represented by formula (4) shown below, and anthracenes represented by formula (5) shown below.

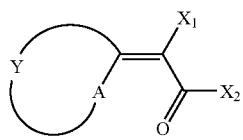

In formula (2), A represents a sulfur atom or NR$_6$, R$_6$ represents a monovalent non-metallic atomic group, Y represents a non-metallic atomic group necessary for forming a basic nucleus of the dye together with adjacent A and the adjacent carbon atom, and X$_1$ and X$_2$ each independently represents a monovalent non-metallic atomic group or X$_1$ and X$_2$ may be combined with each other to form an acidic nucleus of the dye.

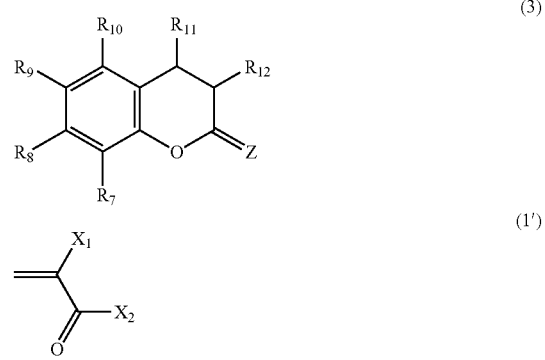

In formula (3), =Z represents an oxo group, a thioxo group, an imino group or an alkylydene group represented by the partial structural formula (1') described above, X$_1$ and X$_2$ have the same meanings as defined in formula (2) respectively, and R$_7$ to R$_{12}$ each independently represents a monovalent non-metallic atomic group.

In formula (4), Ar$_3$ represents an aromatic group which may have a substituent or a heteroaromatic group which may have a substituent, and R$_{13}$ represents a monovalent non-metallic atomic group. R$_{13}$ preferably represents an aromatic group or a heteroaromatic group. Ar$_3$ and R$_{13}$ may be combined with each other to form a ring.

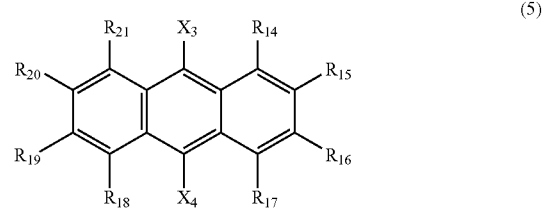

In formula (5), X$_3$, X$_4$ and R$_{14}$ to R$_{21}$ each independently represents a monovalent non-metallic atomic group. Preferably, X$_3$ and X$_4$ each independently represents an electron-donating group having a negative Hammett substituent constant.

In formulae (2) to (5), preferable examples of the monovalent non-metallic atomic group represented by any one of X$_1$ to X$_4$ and R$_6$ to R$_{21}$ include a hydrogen atom, an alkyl group (for example, a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group, a 2-norbornyl group, a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropylsulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group or a 3-butynyl group), an aryl group (for example, a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group or a phosphonatophenyl group), a heteroaryl group (for example, a heteroaryl group derived from thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine), an alkenyl group (for example, a vinyl group, a 1-propenyl group, a 1-butenyl group, a cinnamyl group or a 2-chloro-1-ethenyl group), an alkynyl group (for example, an ethynyl group, a 1-propynyl group, a 1-butynyl group or a trimethylsilylethynyl group), a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$ (alkyl)$_2$), a diarylphosphono group (—PO$_3$ (aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H (aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$ (alkyl)$_2$), a diarylphosphonooxy group (—OPO$_3$ (aryl)$_2$), an alkylarylphosphonooxy group (—OPO$_3$(alkyl) aryl)), a monoalkylphosphonooxy group (—OPO$_3$H (alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group and a nitro group. Among the above-described groups, a hydrogen atom, an alkyl group, an aryl group, a halogen atom, an alkoxy group and an acyl group are particularly preferred.

The basic nucleus of the dye formed by Y together with the adjacent A and the adjacent carbon atom in formula (2) includes, for example, a 5-membered, 6-membered or 7-membered, nitrogen-containing or sulfur-containing heterocyclic ring, and is preferably a 5-membered or 6-membered heterocyclic ring.

As the nitrogen-containing heterocyclic ring, those which are known to constitute basic nuclei in merocyanine dyes described in L. G. Brooker et al, *J. Am. Chem. Soc.*, Vol. 73, pp. 5326 to 5358 (1951) and references cited therein can be preferably used. Specific examples thereof include thiazoles (for example, thiazole, 4-methylthiazole, 4-phenylthiazole, 5-methylthiazole, 5-phenylthiazole, 4,5-dimethylthiazole, 4,5-diphenylthiazole, 4,5-di(p-methoxyphenyl)thiazole or 4-(2-thienyl)thiazole); benzothiazoles (for example, benzothiazole, 4-chlorobenzothiazole, 5-chlorobenzothiazole, 6-chlorobenzothiazole, 7-chlorobenzothiazole, 4-methylbenzothiazole, 5-methylbenzothiazole, 6-methylbenzothiazole, 5-bromobenzothiazole, 4-phenylbenzothiazole, 5-phenylbenzothiazole, 4-methoxybenzothiazole, 5-methoxybenzothiazole, 6-methoxybenzothiazole, 5-iodobenzothiazole, 6-iodobenzothiazole, 4-ethoxybenzothiazole, 5-ethoxybenzothiazole, tetrahydrobenzothiazole, 5,6-dimethoxybenzothiazole, 5,6-dioxymethylenebenzothiazole, 5-hydroxybenzothiazole, 6-hydroxybenzothiazole, 6-dimethylaminobenzothiazole or 5-ethoxycarbonylbenzothiazole); naphthothiazoles (for example, naphtho[1,2]thiazole, naphtho[2,1]thiazole, 5-methoxynaphtho[2,1]thiazole, 5-ethoxynaphtho[2,1]thiazole, 8-methoxynaphtho[1,2]thiazole or 7-methoxynaphtho[1,2]thiazole); thianaphtheno-7',6',4,5-thiazoles (for example, 4'-methoxythianaphtheno-7',6',4,5-thiazole); oxazoles (for example, 4-methyloxazole, 5-methyloxazole, 4-phenyloxazole, 4,5-diphenyloxazole, 4-ethyloxazole, 4,5-dimethyloxazole or 5-phenyloxazole); benzoxazoles (for example, benzoxazole, 5-chlorobenzoxazole, 5-methylbenzoxazole, 5-phenylbenzoxazole, 6-methylbenzoxazole, 5,6-dimethylbenzoxazole, 4,6-dimethylbenzoxazole, 6-methoxybenzoxazole, 5-methoxybenzoxazole, 4-ethoxybenzoxazole, 5-chlorobenzoxazole, 6-methoxybenzoxazole, 5-hydroxybenzoxazole or 6-hydroxybenzoxazole); naphthoxazoles (for example, naphth[1,2]oxazole or naphth[2,1]oxazole); selenazoles (for example, 4-methylselenazole or 4-phenylselenazole); benzoselenazoles (for example, benzoselenazole, 5-chlorobenzoselenazole, 5-methoxybenzoselenazole, 5-hydroxybenzoselenazole or tetrahydrobenzoselenazole); naphthoselenazoles (for example, naphtho[1,2]selenazole or naphtho[2,1]selenazole); thiazolines (for example, thiazoline or 4-methylthiazoline); 2-quinolines (for example, quinoline, 3-methylquinoline, 5-methylquinoline, 7-methylquinoline, 8-methylquinoline, 6-chloroquinoline, 8-chloroquinoline, 6-methoxyquinoline, 6-ethoxyquinoline, 6-hydroxyquinoline or 8-hydroxyquinoline); 4-quinolines (for example, quinoline, 6-methoxyquinoline, 7-methylquinoline or 8-methylquinoline); 1-isoquinolines (for example, isoquinoline or 3,4-dihydroisoquinoline); 3-isoquinolines (for example, isoquinoline); benzimidazoles (for example, 1,3-diethylbenzimidazole or 1-ethyl-3-phenylbenzimidazole); 3,3-dialkylindolenines (for example, 3,3-dimethylindolenine, 3,3,5-trimethylindolenine or 3,3,7-trimethylindolenine); and 2-pyridines (for example, pyridine or 5-methylpyridine); and 4-pyridines (for example, pyridine).

Examples of the sulfur-containing heterocyclic ring include dithiol partial structures in dyes described in JP-A-3-296759.

Specific examples thereof include benzodithiols (for example, benzodithiol, 5-tert-butylbenzodithiol or 5-methylbenzodithiol); naphthodithiols (for example, naphtho[1,2]dithiol or naphtho[2,1]dithiol); and dithiols (for example, 4,5-dimethyldithiol, 4-phenyldithiol, 4-methoxycarbonyldithiol, 4,5-dimethoxycarbonyldithiol, 4,5-ditrifluoromethyldithiol, 4,5-dicyanodithiol, 4-methoxycarbonylmethyldithiol or 4-carboxymethyldithiol).

In the description with respect to the heterocyclic ring above, for convenience and by convention, the names of heterocyclic mother skeletons are used. In the case of constituting the basic nucleus partial structure in the sensitizing dye, the heterocyclic ring is introduced in the form of a substituent of alkylydene type where a degree of unsaturation is decreased one step. For example, a benzothiazole skeleton is introduced as a 3-substituted-2(3H)-benzothiazolylidene group.

Of the sensitizing dyes having an absorption maximum in a wavelength range of 350 to 450 nm, dyes represented by formula (1) shown below are more preferable in view of high sensitivity.

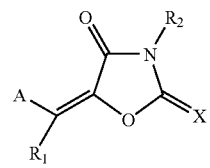

(1)

In formula (1), A represents an aromatic cyclic group which may have a substituent or a heterocyclic group which may have a substituent, X represents an oxygen atom, a sulfur atom or $=N(R_3)$, and $R_1$, $R_2$ and $R_3$ each independently represents a hydrogen atom or a monovalent non-metallic atomic group, or A and $R_1$ or $R_2$ and $R_3$ may be combined with each other to form an aliphatic or aromatic ring.

The formula (1) will be described in more detail below. $R_1$, $R_2$ and $R_3$ each independently represents a hydrogen atom or a monovalent non-metallic atomic group, preferably a substituted or unsubstituted alkyl group, a substituted or unsubstituted alkenyl group, a substituted or unsubstituted aryl group, a substituted or unsubstituted aromatic heterocyclic residue, a substituted or unsubstituted alkoxy group, a substituted or unsubstituted alkylthio group, a hydroxy group or a halogen atom.

Preferable examples of $R_1$, $R_2$ and $R_3$ will be specifically described below. Preferable examples of the alkyl group include a straight chain, branched or cyclic alkyl group having from 1 to 20 carbon atoms. Specific examples thereof include a methyl group, an ethyl group, a propyl group, a butyl group, a pentyl group, a hexyl group, a heptyl group, an octyl group, a nonyl group, a decyl group, an undecyl group, a dodecyl group, a tridecyl group, a hexadecyl group, an octadecyl group, an eucosyl group, an isopropyl group, an isobutyl group, a sec-butyl group, a tert-butyl group, an isopentyl group, a neopentyl group, a 1-methylbutyl group, an isohexyl group, a 2-ethylhexyl group, a 2-methylhexyl group, a cyclohexyl group, a cyclopentyl group and a 2-norbornyl group. Among them, a straight chain alkyl group having from 1 to 12 carbon atoms, a branched alkyl group having from 3 to 12 carbon atoms and a cyclic alkyl group having from 5 to 10 carbon atoms are more preferable.

As the substituent for the substituted alkyl group, a monovalent non-metallic atomic group exclusive of a hydrogen atom is used. Preferable examples thereof include a halogen atom (for example, —F, —Br, —Cl or —I), a hydroxy group, an alkoxy group, an aryloxy group, a mercapto group, an alkylthio group, an arylthio group, an alkyldithio group, an aryldithio group, an amino group, an N-alkylamino group, an N,N-dialkylamino group, an N-arylamino group, an N,N-diarylamino group, an N-alkyl-N-arylamino group, an acyloxy group, a carbamoyloxy group, an N-alkylcarbamoyloxy group, an N-arylcarbamoyloxy group, an N,N-dialkylcarbamoyloxy group, an N,N-diarylcarbamoyloxy group, an N-alkyl-N-arylcarbamoyloxy group, an alkylsulfoxy group, an arylsulfoxy group, an acylthio group, an acylamino group, an N-alkylacylamino group, an N-arylacylamino group, a ureido group, an N'-alkylureido group, an N',N'-dialkylureido group, an N'-arylureido group, an N',N'-diarylureido group, an N'-alkyl-N'-arylureido group, an N-alkylureido group, an N-arylureido group, an N'-alkyl-N-alkylureido group, an N'-alkyl-N-arylureido group, an N',N'-dialkyl-N-alkylureido group, an N',N'-dialkyl-N-arylureido group, an N'-aryl-N-alkylureido group, an N'-aryl-N-arylureido group, an N',N'-diaryl-N-alkylureido group, an N',N'-diaryl-N-arylureido group, an N'-alkyl-N'-aryl-N-alkylureido group, an N'-alkyl-N'-aryl-N-arylureido group, an alkoxycarbonylamino group, an aryloxycarbonylamino group, an N-alkyl-N-alkoxycarbonylamino group, an N-alkyl-N-aryloxycarbonylamino group, an N-aryl-N-alkoxycarbonylamino group, an N-aryl-N-aryloxycarbonylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N,N-diarylcarbamoyl group, an N-alkyl-N-arylcarbamoyl group, an alkylsulfinyl group, an arylsulfinyl group, an alkylsulfonyl group, an arylsulfonyl group, a sulfo group (—SO$_3$H) and its conjugated base group (hereinafter referred to as a "sulfonato group"), an alkoxysulfonyl group, an aryloxysulfonyl group, a sulfinamoyl group, an N-alkylsulfinamoyl group, an N,N-dialkylsulfinamoyl group, an N-arylsulfinamoyl group, an N,N-diarylsulfinamoyl group, an N-alkyl-N-arylsulfinamoyl group, a sulfamoyl group, an N-alkylsulfamoyl group, an N,N-dialkylsulfamoyl group, an N-arylsulfamoyl group, an N,N-diarylsulfamoyl group, an N-alkyl-N-arylsulfamoyl group, a phosphono group (—PO$_3$H$_2$) and its conjugated base group (hereinafter referred to as a "phosphonato group"), a dialkylphosphono group (—PO$_3$(alkyl)$_2$), a diarylphosphono group (—PO$_3$(aryl)$_2$), an alkylarylphosphono group (—PO$_3$(alkyl)(aryl)), a monoalkylphosphono group (—PO$_3$H(alkyl)) and its conjugated base group (hereinafter referred to as an "alkylphosphonato group"), a monoarylphosphono group (—PO$_3$H(aryl)) and its conjugated base group (hereinafter referred to as an "arylphosphonato group"), a phosphonooxy group (—OPO$_3$H$_2$) and its conjugated base group (hereinafter referred to as a "phosphonatooxy group"), a dialkylphosphonooxy group (—OPO$_3$(alkyl)$_2$), a diarylphosphonooxy group (—OPO$_3$(aryl)$_2$), an alkylarylphosphonooxy group (—OPO$_3$(alkyl)(aryl)), a monoalkylphosphonooxy group (—OPO$_3$H(alkyl)) and its conjugated base group (hereinafter referred to as an "alkylphosphonatooxy group"), a monoarylphosphonooxy group (—OPO$_3$H(aryl)) and its conjugated base group (hereinafter referred to as an "arylphosphonatooxy group"), a cyano group, a nitro group, an aryl group, a heteroaryl group, an alkenyl group and an alkynyl group.

In the substituents, specific examples of the alkyl group include those described for the alkyl group above. Specific examples of the aryl group include a phenyl group, a biphenyl group, a naphthyl group, a tolyl group, a xylyl group, a mesityl group, a cumenyl group, a chlorophenyl group, a bromophenyl group, a chloromethylphenyl group, a hydroxyphenyl group, a methoxyphenyl group, an ethoxyphenyl group, a phenoxyphenyl group, an acetoxyphenyl group, a benzoyloxyphenyl group, a methylthiophenyl group, a phenylthiophenyl group, a methylaminophenyl group, a dimethylaminophenyl group, an acetylaminophenyl group, a carboxyphenyl group, a methoxycarbonylphenyl group, an ethoxycarbonylphenyl group, a phenoxycarbonylphenyl group, an N-phenylcarbamoylphenyl group, a nitrophenyl group, a cyanophenyl group, a sulfophenyl group, a sulfonatophenyl group, a phosphonophenyl group and a phosphonatophenyl group.

Examples of the heteroaryl group represented by any one of R$_1$, R$_2$ and R$_3$ preferably include a monocyclic or polycyclic aromatic cyclic group containing at least one of a nitrogen atom, an oxygen atom and a sulfur atom. Examples of especially preferable heteroaryl group include a heteroaryl group derived from thiophene, thiathrene, furan, pyran, isobenzofuran, chromene, xanthene, phenoxazine, pyrrole, pyrazole, isothiazole, isoxazole, pyrazine, pyrimidine, pyridazine, indolizine, isoindolizine, indole, indazole, purine, quinolizine, isoquinoline, phthalazine, naphthylidine, quinazoline, cinnoline, pteridine, carbazole, carboline, phenanthrene, acridine, perimidine, phenanthroline, phthalazine, phenarsazine, phenoxazine, furazane or phenoxazine. These groups may be benzo-fused or may have a substituent.

Also, examples of the alkenyl group represented by any one of R$_1$, R$_2$ and R$_3$ preferably include a vinyl group, a 1-propenyl group, a 1-butenyl group, a cinnamyl group and a 2-chloro-1-ethenyl group. Examples of the alkynyl group include an ethynyl group, a 1-propynyl group, a 1-butynyl group and a trimethylsilylethynyl group. Examples of G$_1$ in the acyl group (G$_1$CO—) include a hydrogen atom and the above-described alkyl group and aryl group. Of the substituents, a halogen atom (for example, —F, —Br, —Cl or —I), an alkoxy group, an aryloxy group, an alkylthio group, an arylthio group, an N-alkylamino group, an N,N-dialkylamino group, an acyloxy group, an N-alkylcarbamoyloxy group, an N-arylcarbamoyloxy group, an acylamino group, a formyl group, an acyl group, a carboxyl group, an alkoxycarbonyl group, an aryloxycarbonyl group, a carbamoyl group, an N-alkylcarbamoyl group, an N,N-dialkylcarbamoyl group, an N-arylcarbamoyl group, an N-alkyl-N-arylcarbamoyl group, a sulfo group, a sulfonato group, a sulfamoyl group, an N-alkylsulfamoyl group, an N,N-dialkylsulfamoyl group, an N-arylsulfamoyl group, an N-alkyl-N-arylsulfamoyl group, a phosphono group, a phosphonato group, a dialkylphosphono group, a diarylphosphono group, a monoalkylphosphono group, an alkylphosphonato group, a monoarylphosphono group, an arylphosphonato group, a phosphonooxy group, a phosphonatooxy group, an aryl group and an alkenyl group are more preferable.

On the other hand, as an alkylene group in the substituted alkyl group, a divalent organic residue resulting from elimination of any one of hydrogen atoms on the above-described alkyl group having from 1 to 20 carbon atoms can be enumerated. Examples of preferable alkylene group include a straight chain alkylene group having from 1 to 12 carbon atoms, a branched alkylene group having from 3 to 12 carbon atoms and a cyclic alkylene group having from 5 to 10 carbon atoms.

Specific examples of the preferable substituted alkyl group represented by any one of R$_1$, R$_2$ and R$_3$, which is obtained by combining the above-described substituent with the alkylene group, include a chloromethyl group, a bromomethyl group, a 2-chloroethyl group, a trifluoromethyl group, a methoxymethyl group, a methoxyethoxyethyl group, an allyloxymethyl group, a phenoxymethyl group, a methylthiomethyl group, a tolylthiomethyl group, an ethylaminoethyl group, a diethylaminopropyl group, a morpholinopropyl group, an acetyloxymethyl group, a benzoyloxymethyl group, an N-cyclohexylcarbamoyloxyethyl group, an N-phenylcarbamoyloxyethyl group, an acetylaminoethyl group, an N-methylbenzoylaminopropyl group, a 2-oxoethyl group, a 2-oxopropyl group, a carboxypropyl group, a methoxycarbonylethyl group, an allyloxycarbonylbutyl group, a chlorophenoxycarbonylmethyl group, a carbamoylmethyl group, an N-methylcarbamoylethyl group, an N,N-dipropylcarbamoylmethyl group, an N-(methoxyphenyl)carbamoylethyl group, an N-methyl-N-(sulfophenyl)carbamoylmethyl group, a sulfobutyl group, a sulfonatobutyl group, a sulfamoylbutyl group, an N-ethylsulfamoylmethyl group, an N,N-dipropyl-sulfamoylpropyl group, an N-tolylsulfamoylpropyl group, an N-methyl-N-(phosphonophenyl)sulfamoyloctyl group, a phosphonobutyl group, a phosphonatohexyl group, a diethylphosphonobutyl group, a diphenylphosphonopropyl group, a methylphosphonobutyl group, a methylphosphonatobutyl group, a tolylphosphonohexyl group, a tolylphosphonatohexyl group, a phosphonooxypropyl group, a phosphonatooxybutyl group, a benzyl group, a phenethyl group, an α-methylbenzyl group, a 1-methyl-1-phenylethyl group, a p-methylbenzyl group, a cinnamyl group, an allyl group, a 1-propenylmethyl group, a 2-butenyl group, a 2-methylallyl group, a 2-methylpropenylmethyl group, a 2-propynyl group, a 2-butynyl group and a 3-butynyl group.

Preferable examples of the aryl group represented by any one of $R_1$, $R_2$ and $R_3$ include a fused ring formed from one to three benzene rings and a fused ring formed from a benzene ring and a 5-membered unsaturated ring. Specific examples thereof include a phenyl group, a naphthyl group, an anthryl group, a phenanthryl group, an indenyl group, an acenaphthenyl group and a fluorenyl group. Among them, a phenyl group and a naphthyl group are more preferable.

Specific examples of the preferable substituted aryl group represented by any one of $R_1$, $R_2$ and $R_3$ include aryl groups having a monovalent non-metallic atomic group exclusive of a hydrogen atom as a substituent on the ring-forming carbon atom of the above-described aryl group. Preferable examples of the substituent include the above-described alkyl groups and substituted alkyl groups, and the substituents described for the above-described substituted alkyl group. Specific examples of the preferable substituted aryl group include a biphenyl group, a tolyl group, a xylyl group, a mesityl group, a cumenyl group, a chlorophenyl group, a bromophenyl group, a fluorophenyl group, a chloromethylphenyl group, a trifluoromethylphenyl group, a hydroxyphenyl group, a methoxyphenyl group, a methoxyethoxyphenyl group, an allyloxyphenyl group, a phenoxyphenyl group, a methylthiophenyl group, a tolylthiophenyl group, an ethylaminophenyl group, a diethylaminophenyl group, a morpholinophenyl group, an acetyloxyphenyl group, a benzoyloxyphenyl group, an N-cyclohexylcarbamoyloxyphenyl group, an N-phenylcarbamoyloxyphenyl group, an acetylaminophenyl group, an N-methylbenzoylaminophenyl group, a carboxyphenyl group, a methoxycarbonylphenyl group, an allyloxycarbonylphenyl group, a chlorophenoxycarbonylphenyl group, a carbamoylphenyl group, an N-methylcarbamoylphenyl group, an N,N-dipropylcarbamoyl-phenyl group, an N-(methoxyphenyl)carbamoylphenyl group, an N-methyl-N-(sulfophenyl)carbamoylphenyl group, a sulfophenyl group, a sulfonatophenyl group, a sulfamoylphenyl group, an N-ethylsulfamoylphenyl group, an N,N-dipropylsulfamoylphenyl group, an N-tolylsulfamoylphenyl group, an N-methyl-N-(phosphonophenyl)sulfamoylphenyl group, a phosphonophenyl group, a phosphonatophenyl group, a diethylphosphonophenyl group, a diphenylphosphonophenyl group, a methylphosphonophenyl group, a methylphosphonatophenyl group, a tolylphosphonophenyl group, a tolylphosphonatophenyl group, an allylphenyl group, a 1-propenylmethylphenyl group, a 2-butenylphenyl group, a 2-methylallylphenyl group, a 2-methylpropenylphenyl group, a 2-propynylphenyl group, a 2-butynylphenyl group and a 3-butynylphenyl group.

Preferable examples of the substituted or unsubstituted alkenyl group and the substituted or unsubstituted aromatic heterocyclic residue represented by any one of $R_1$, $R_2$ and $R_3$ include those described with respect to the alkenyl group and heteroaryl group above.

Next, A in formula (1) will be described below. A represents an aromatic cyclic group which may have a substituent or heterocyclic group which may have a substituent. Specific examples of the aromatic cyclic group which may have a substituent or heterocyclic group which may have a substituent include those described for any one of $R_1$, $R_2$ and $R_3$ in formula (1).

The sensitizing dye represented by formula (1) according to the invention is obtained by a condensation reaction of the above-described acidic nucleus or an active methyl group-containing acidic nucleus with a substituted or unsubstituted, aromatic ring or hetero ring and can be synthesized with reference to JP-B-59-28329.

Preferable specific examples (D1) to (D42) of the compound represented by formula (1) are set forth below. Further, when isomers with respect to a double bond connecting an acidic nucleus and a basic nucleus are present in each of the compounds, the invention should not be construed as being limited to any one of the isomers.

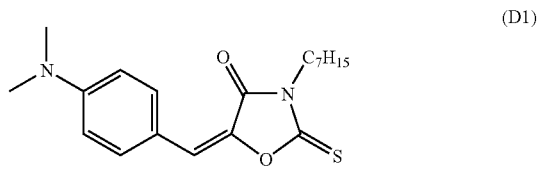
(D1)

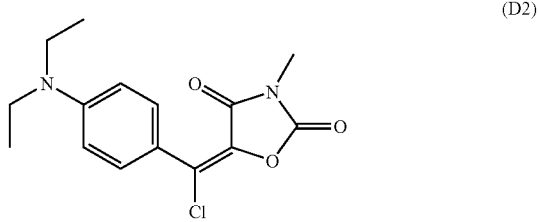
(D2)

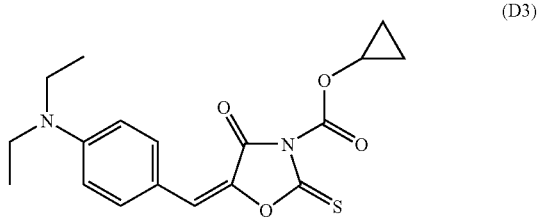
(D3)

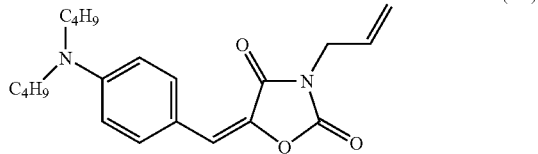
(D4)

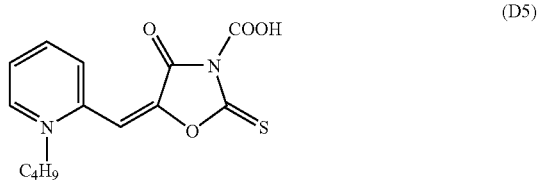
(D5)

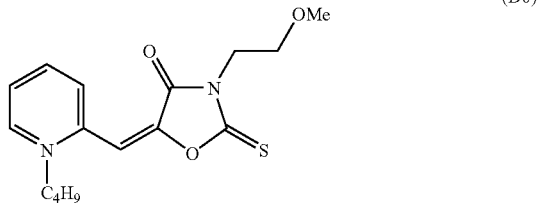
(D6)

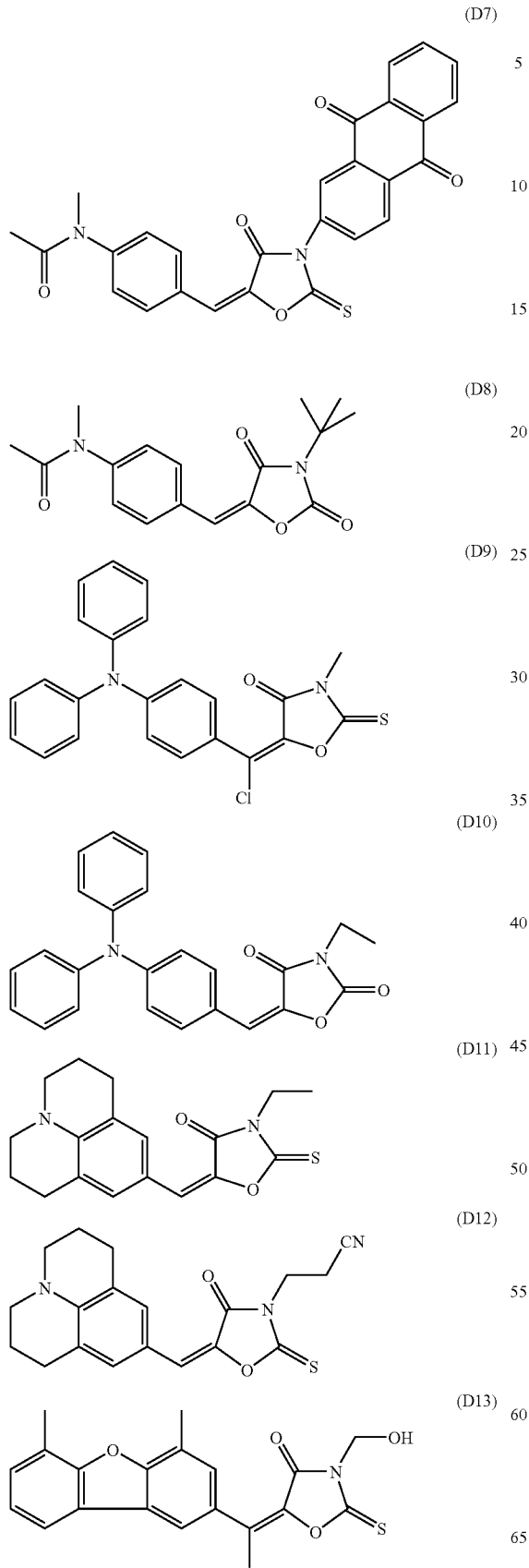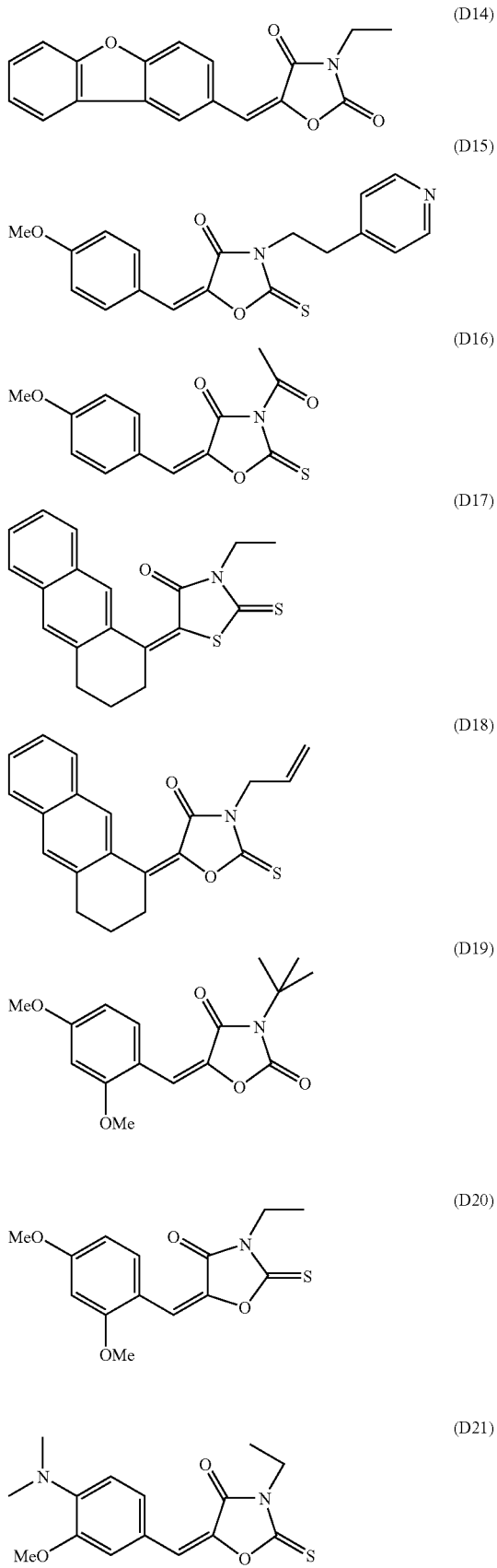

-continued
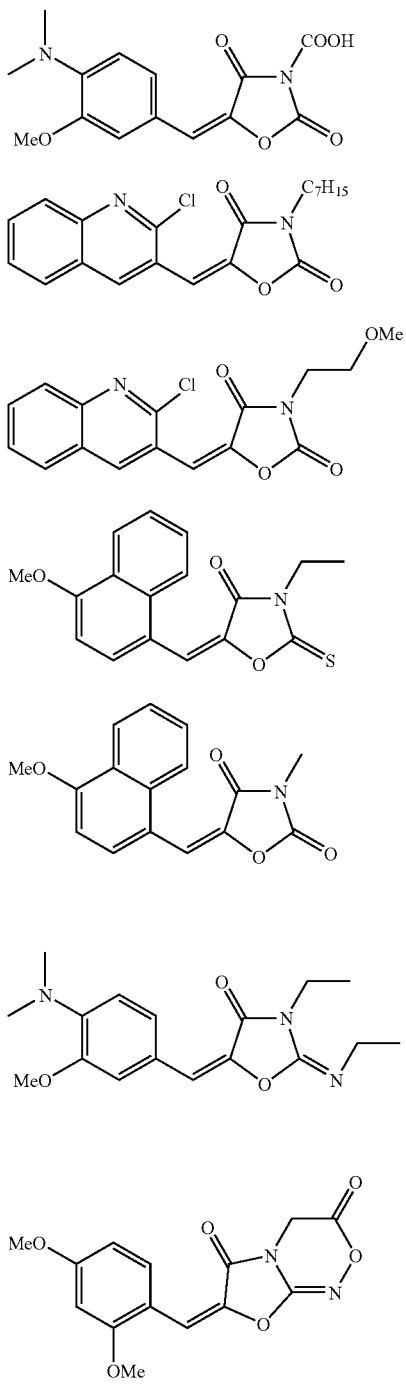
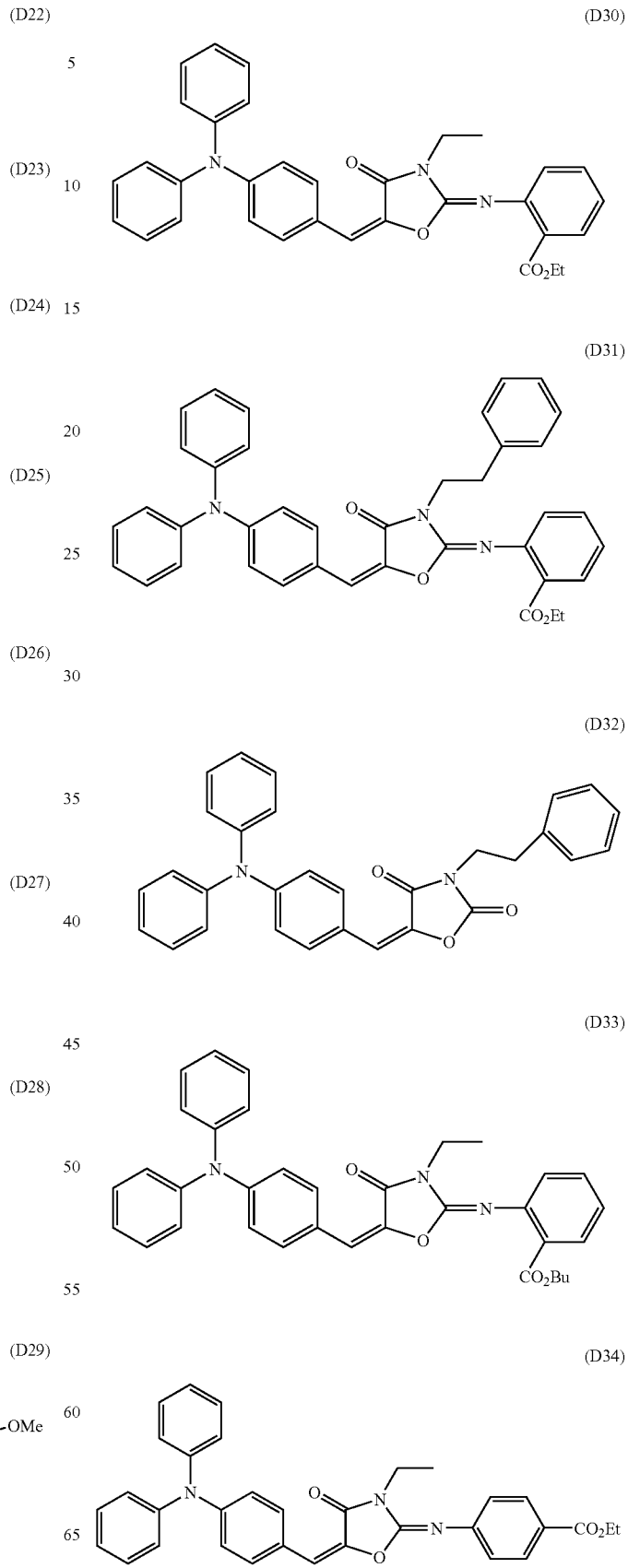

-continued

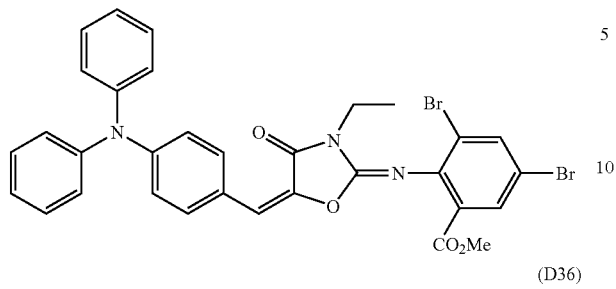
(D35)

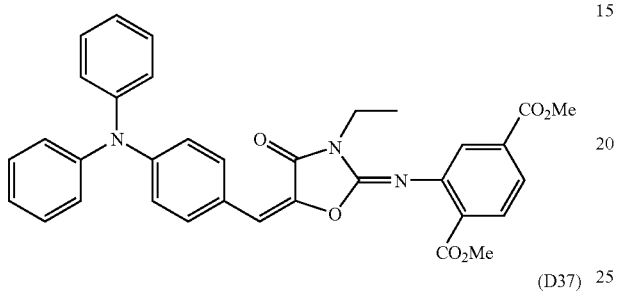
(D36)

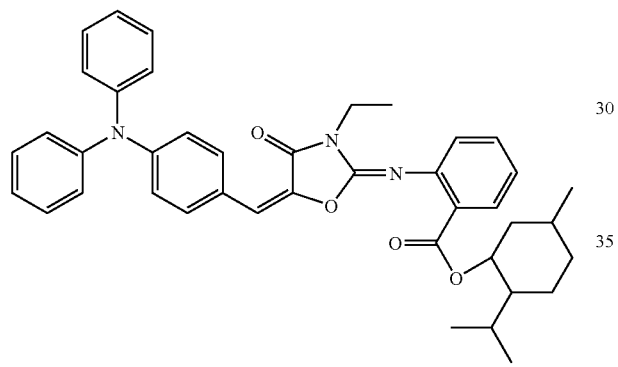
(D37)

(D38)

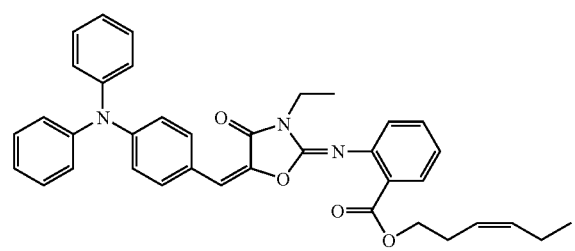

(D39)

-continued (D40)

(D41)

(D42)

Since the sensitizing dyes have absorption coefficients different from each other depending on the structures thereof, the amount added varies according to the structure of the sensitizing dye to be used. The optimal amount thereof is an amount in that absorbance of the photosensitive layer including the sensitizing dye at the laser emission wavelength is 0.6 or less, preferably in a range of 0.05 to 0.55, more preferably in a range of 0.1 to 0.3, and still more preferably in a range of 0.1 to 0.45.

[Photopolymerization Initiator]

Now, the photopolymerization initiator which is incorporated into the photosensitive layer for use in the invention is described below. The photopolymerization initiator incorporated into the photosensitive layer for use in the invention can be appropriately selected from various kinds of known photopolymerization initiators or combination systems of two or more photopolymerization initiators (photopolymerization initiation system) described in patents and literature. In the invention, the photopolymerization initiator individually used and the combination system of two or more photopolymerization initiators are also collectively referred to as a photopolymerization initiator.

For instance, in the case of using light having a wavelength of around 400 nm as the light source, benzyl, benzoyl ether, Michler's ketone, anthraquinone, thioxantone, acridine, phenazine, benzophenone and a hexaarylbisimidazole compound are broadly used.

In case of using visible light having a wavelength of 400 nm or more as the light source, various photopolymerization initiators have also been proposed. For instance, a certain kind of photo-reducing dyes, for example, Rose Bengal, Eosin or erythrosine, as described in U.S. Pat. No. 2,850,445, and a combination system comprising a dye and a photopolymerization initiator, for example, a composite initiator system comprising a dye and an amine as described in JP-B-44-20189, a combination system of a hexaarylbiimidazole, a radical generator and a dye as described in JP-B-45-37377, a combination system of a hexaarylbiimidazole and a p-dialkylaminobenzylidene kotone as described in JP-B-47-2528 and JP-A-54-155292, a combination system of a cyclic cis-α-dicarbonyl compound and a dye as described in JP-A-48-84183, a combination system of a cyclic triazine and a merocyanine dye as described in JP-A-54-151024, a combination system of a 3-ketocoumarin and an activator as described in JP-A-52-112681 and JP-A-58-15503, a combination system of a biimidazole, a styrene derivative and a thiol as described in JP-A-59-140203, a combination system of an organic peroxide and a dye as described in JP-A-59-1504, JP-A-59-140203, JP-A-59-189340, JP-A-62-174203, JP-B-62-1641 and U.S. Pat. No. 4,766,055, a combination system of a dye and an active halogen compound as described in JP-A-63-178105, JP-A-63-258903 and JP-A-2-63054, a combination system of a dye and a borate compound as described in JP-A-62-143044, JP-A-62-150242, JP-A-64-13140, JP-A-64-13141, JP-A-64-13142, JP-A-64-13143, JP-A-64-13144, JP-A-64-17048, JP-A-1-229003, JP-A-1-298348 and JP-A-1-138204, and a combination system of a dye having a rhodanine ring and a radical generator as described in JP-A-2-179643 and JP-A-2-244050 are exemplified.

As the photopolymerization initiator, the hexaarylbisimidazole compound is particularly preferable.

As the hexaarylbisimidazole compound, various compounds described, for example, in European Patents 24,629 and 107,792, U.S. Pat. No. 4,410,621, European Patent 215, 453 and German Patent 3,211,312 can be used.

Preferable examples of the hexaarylbisimidazole compound include 2,4,5,2',4',5'-hexaphenylbisimidazole, 2,2'-bis (2-chlorophenyl)-4,5,4',5'-tetraphenylbisimidazole, 2,2'-bis (2-bromophenyl)-4,5,4',5'-tetraphenylbisimidazole, 2,2'-bis (2,4-dichlorophenyl)-4,4',5,5'-tetraphenylbisimidazole, 2,2'-bis(2-chlorophenyl)-4,5,4',5'-tetrakis(3-methoxyphenyl) bisimidazole, 2,5,2',5'-tetrakis(2-chlorophenyl)-4,4'-bis(3,4-dimethoxyphenyl)bisimidazole, 2,2'-bis(2,6-dichlorophenyl)-4,5,4',5'-tetraphenylbisimidazole, 2,2'-bis (2-nitrophenyl)-4,5,4',5'-tetraphenylbisimidazole, 2,2'-di-o-tolyl-4,5,4',5'-tetraphenylbisimidazole, 2,2'-bis(2-ethoxyphenyl)-4,5,4',5'-tetraphenylbisimidazole and 2,2'-bis (2,6-difluorophenyl)-4,5,4',5'-tetraphenylbisimidazole.

The hexaarylbisimidazole compounds may be used as a mixture of two or more thereof.

The amount of the hexaarylbisimidazole compound used is ordinarily in a range from 0.05 to 50 parts by weight, preferably from 0.2 to 30 parts by weight, based on 100 parts by weight of the total amount of the addition polymerizable compound described hereinafter.

Other photopolymerization initiator described hereinafter may be used together with the hexaarylbisimidazole compound.

It is also known that the photo-initiation ability is moreover enhanced by adding to the above-described photopolymerization initiator, a hydrogen donating compound, for example, a thiol compound (e.g., 2-mercaptobenzothiazole, 2-mercaptobenzimidazole or 2-mercaptobenzoxazole) or an amine compound (e.g., N-phenylglycine or N,N-dialkylamino aromatic alkyl ester), if desired. As the hydrogen donating compound having a particularly high photo-initiation ability suitable for the invention, a mercapto group-containing compound is exemplified.

More preferable examples of the hydrogen donating compound include sulfur-containing compounds (mercapto group-containing heterocyclic compounds) represented by formula (2) or (3) shown below. In formulae (2) and (3), the structures of tautomers are indicated respectively.

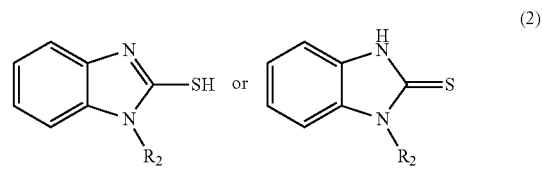

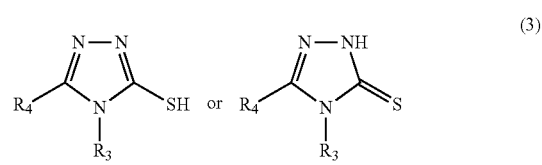

In formulae (2) and (3), $R_2$, $R_3$ and $R_4$, each independently represents a hydrogen atom, an unsubstituted or substituted, straight-chain or branched alkyl group having from 1 to 18 carbon atoms, an unsubstituted or substituted cyclic alkyl group having from 5 to 20 carbon atoms or an aromatic group. Examples of the substituent include a halogen atom, a hydroxy group, an amino group, a thiol group, an acetyl group and a carboxyl group.

Specific preferable examples (SH1) to (SH20) of the compound represented by formula (2) or (3) are set forth below, but the invention should not be construed as being limited thereto. The structures shown below are indicated by the —SH group-containing structure of the tautomers.

Specific examples of the compound represented by formula (2):

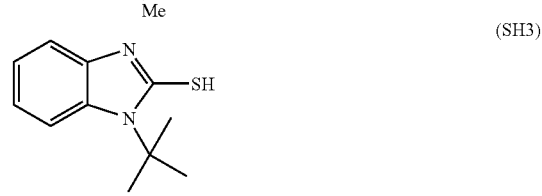

-continued
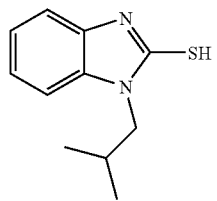
(SH4)
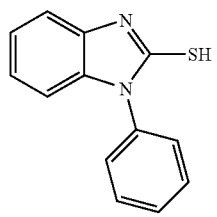
(SH5)
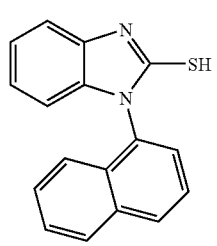
(SH6)
Specific examples of the compound represented by formula (3):
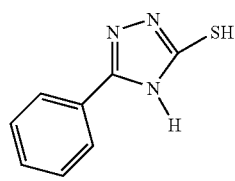
(SH7)
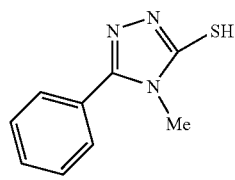
(SH8)
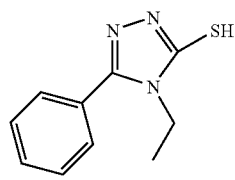
(SH9)
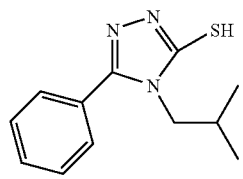
(SH10)
-continued
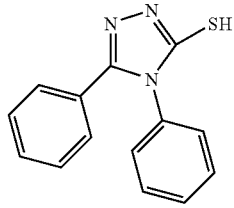
(SH11)
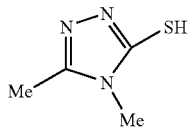
(SH12)
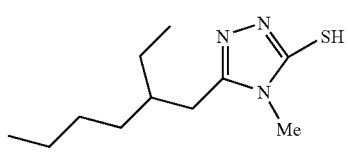
(SH13)
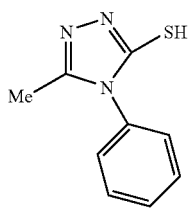
(SH14)
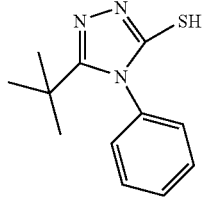
(SH15)
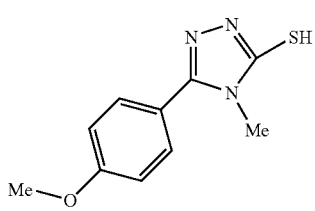
(SH16)
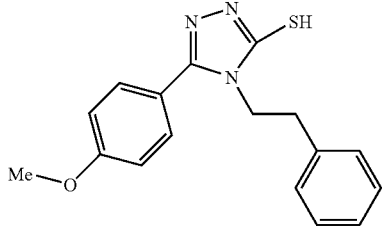
(SH17)
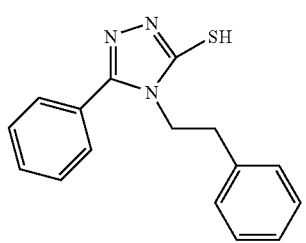
(SH18)

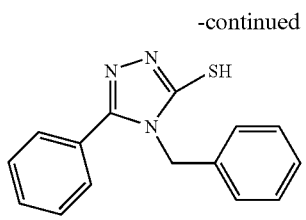
(SH19)

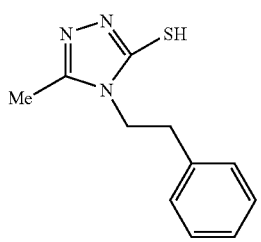
(SH20)

The mercapto group-containing heterocyclic compound is used at a ratio of 0.2 to 10.0 moles, per mole of the hexaarylbisimidazole compound added to obtain the optimal result. The ratio is preferably from 0.5 to 6.0 moles, more preferably from 0.5 to 4.0 moles, per mole of the hexaarylbisimidazole compound added.

[Addition Polymerizable Compound having an Ethylenically Unsaturated Double Bond]

The addition polymerizable compound having an ethylenically unsaturated double bond incorporated into the photosensitive layer for use in the invention can be appropriately selected from compounds having at least one, preferably two or more ethylenically unsaturated double bond groups.

The compound has a chemical form, for example, a monomer, a prepolymer (i.e., a dimmer, trimer or oligomer), a copolymer thereof or a mixture thereof.

Examples of the monomer and copolymer include esters between an unsaturated carboxylic acid (for example, acrylic acid, methacrylic acid, itaconic acid, crotonic acid, isocrotonic acid or maleic acid) and an aliphatic polyhydric alcohol compound and amides between an unsaturated carboxylic acid and an aliphatic polyvalent amine compound.

Specific examples of the monomer of the ester between an aliphatic polyhydric alcohol compound and an unsaturated carboxylic acid include:

acrylates, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate or polyester acrylate oligomer;

methacrylates, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl]dimethylmethane or bis-[p-(methacryloxyethoxy)phenyl]dimethylmethane;

itaconates, for example, ethylene glydcol diitaconate, propylene glycol diitaconate, 1,3-butanediol diitaconate, 1,4-butanediol diitaconate, tetramethylene glycol diitaconate, pentaerythritol diitaconate or sorbitol tetraitaconate;

crotonatates, for example, ethylene glycol dicrotonate, tetramethylene glycol dicrotonate, pentaerythritol dicrotonate or sorbitol tetradicrotonate;

isocrotonates, for example, ethylene glycol diisocrotonate, pentaerythritol diisocrotonate or sorbitol tetraisocrotonate; and maleates, for example, ethylene glycol dimaleate, triethylene glycol dimaleate, pentaerythritol dimaleate or sorbitol tetramaleate.

Further, mixtures of the ester monomers are exemplified.

Also, specific examples of the monomer of the amide between an aliphatic polyvalent amine compound and an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide and xylylenebismethacrylamide.

Also, urethane acrylates as described in JP-A-51-37193, polyester acrylates as described in JP-A-48-64183, JP-B-49-43191 and JP-B-52-30490, and polyfunctional acrylates or methacrylates, for example, epoxyacrylates obtained by reacting an epoxy resin with (meth) acrylic acid are exemplified. Further, photo-curable monomers and oligomers described in *Nippon Secchaku Kyokaishi* (*Journal of Japan Adhesion Society*), Vol. 20, No. 7, pages 300 to 308 (1984) can also be used.

Specifically, NK OLIGO U-4HA, NK OLIGO U-4H, NK OLIGO U-6HA, NK OLIGO U-6ELH, NK OLIGO U-108A, NK OLIGO U-1084A, NK OLIGO U-200AX, NK OLIGO U-122A, NK OLIGO U-340A, NK OLIGO UA-324A and NK OLIGO UA-100 (all of which are produced by Shin-Nakamura Chemical Co., Ltd.); UA-306H, AI-600, UA-101T, UA-101I, UA-306T and UA-306I (all of which are produced by Kyoeisha Chemical Co., Ltd.); ART RESIN UN-9200A, ART RESIN UN-3320HA, ART RESIN UN-3320HB, ART RESIN UN-3320HC, ART RESIN SH-380G, ART RESIN SH-500 and ART RESIN SH-9832 (all of which are produced by Negami Chemical Industrial Co., Ltd.); and PLEX 6661-O (produced by Degussa AG, Germany) are exemplified.

The amount of the addition polymerizable compound having an ethylenically unsaturated double bond used is preferably in a range of 5 to 90% by weight, more preferably in a range of 20 to 75% by weight, based on the total components of the photosensitive layer.

[Binder Polymer]

It is preferred in the invention that the photosensitive layer contains a binder polymer. A preferable material used as the binder polymer in the invention is a polymer comprising a repeating unit represented by the following formula (1):

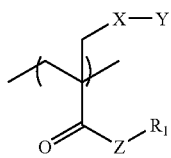
(1)

In formula (1), X represents an oxygen atom, a sulfur atom or a —NH— group, Y represents a hydrogen atom, an alkyl group having from 1 to 12 carbon atoms, a cyclic alkyl group having from 5 to 12 carbon atoms or a group including an aromatic ring having from 6 to 20 carbon atoms, Z represents an oxygen atom, a sulfur atom or a —NH— group, and $R_1$ represents an alkyl group having from 1 to 18 carbon atoms, an alkyl group including an alicyclic structure having from 5 to 20 carbon atoms or a group containing an aromatic ring having from 6 to 20 carbon atoms.

The binder polymer preferably used in the invention not only functions as a film-forming agent of the photosensitive layer but also is required to be dissolved in an alkali developer. Specifically, an organic polymer soluble or swellable in alkali water is used as the binder polymer. Further, in order to form a stronger film by photopolymerization, the binder polymer more preferably includes a repeating unit having a radical addition/crosslinking property. Therefore, the binder polymer preferably includes at least three kinds of repeating units including (a) a repeating unit imparting an alkali-solubility and (b) a repeating unit imparting a radical crosslinking property in addition to the repeating unit represented by formula (1). Specifically, the binder polymer used in the invention is preferably a copolymer containing these three components at an appropriate rate.

Specific examples of the repeating unit represented by formula (1) include the structures represented by (1-1) to (1-9) shown below.

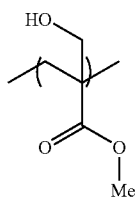
(1-1)

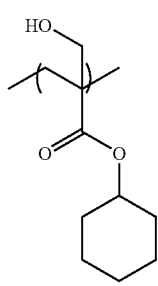
(1-2)

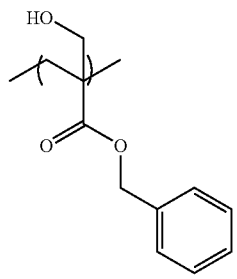
(1-3)

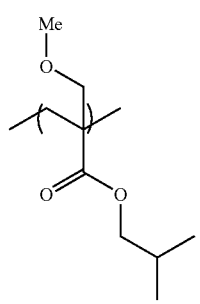
(1-4)

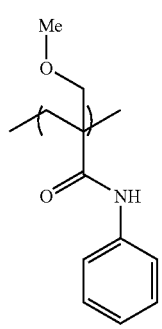
(1-5)

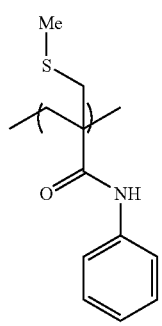
(1-6)

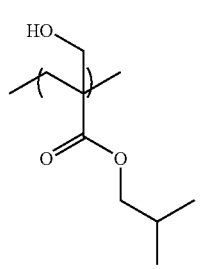
(1-7)

-continued
(1-8)
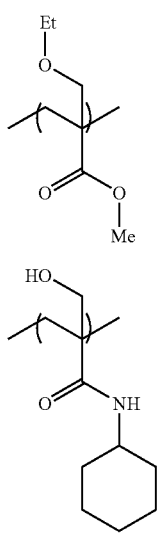
(1-9)
The content of the repeating unit represented by formula (1) is ordinarily from 1 to 40 units, preferably from 3 to 25 units, and more preferably from 5 to 15 units, taking the number of the total repeating units as 100.
Specific examples of the repeating unit (a) imparting an alkali-solubility include the structures represented by (a-1) to (a-13) shown below.
a-1
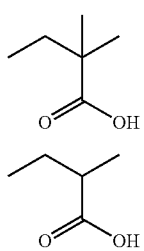
a-2
a-3
a-4
a-5
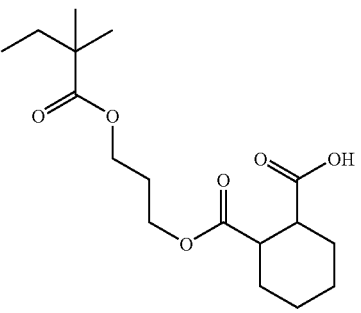
a-6
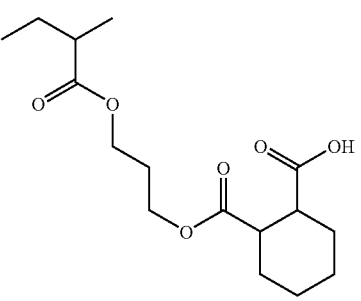
a-7
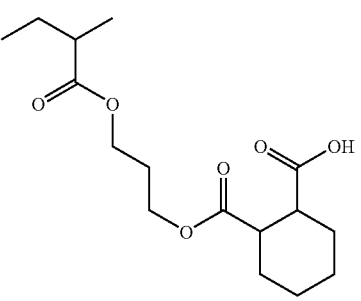
a-8
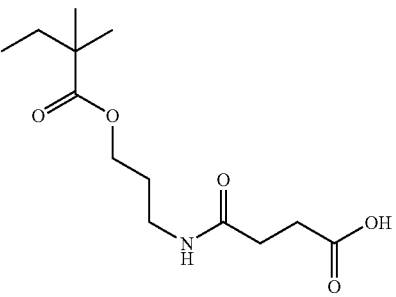
a-9
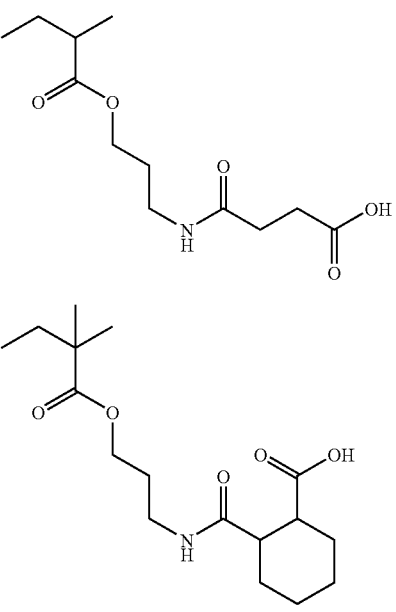

-continued a-10
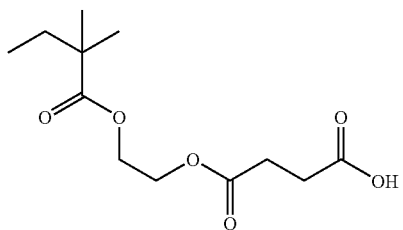

a-11
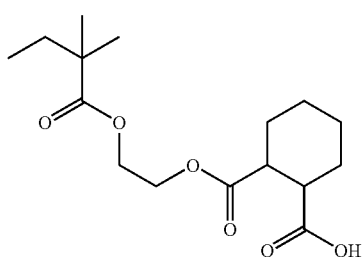

a-12
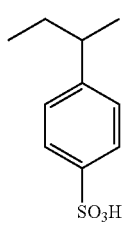

a-13
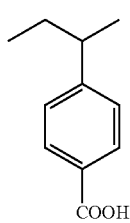

The content of the repeating unit (a) imparting an alkali-solubility is ordinarily from 5 to 50 units, preferably from 5 to 25 units, and more preferably from 5 to 15 units, taking the number of the total repeating units as 100.

Specific examples of the repeating unit (b) imparting a radical crosslinking property include the structures represented by (b-1) to (b-11) shown below.

b-1
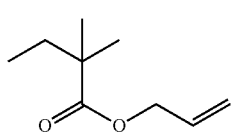

b-2
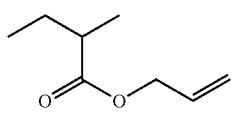

b-3
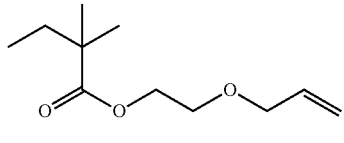

-continued b-4
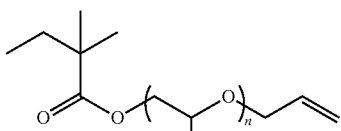

b-5
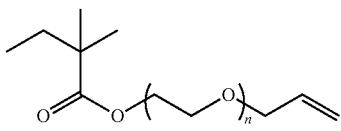

b-6
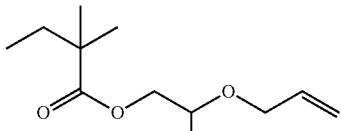

b-7
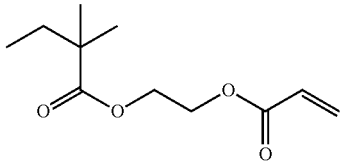

b-8
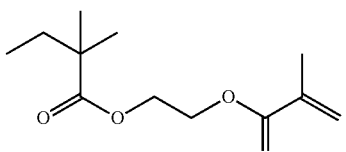

b-9
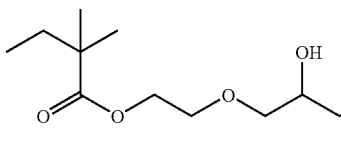

b-10
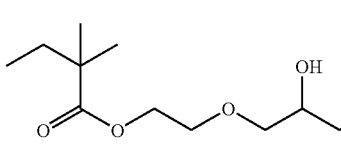

b-11
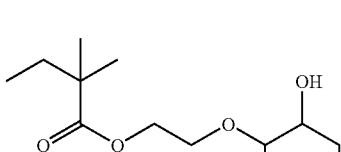

The content of the repeating unit (b) imparting a radical crosslinking property is ordinarily from 5 to 90 units, preferably from 20 to 85 units, and more preferably from 40 to 80 units, taking the number of the total repeating units as 100.

Specific examples of preferable combination of the repeating unit represented by formula (1), the repeating unit (a) and the repeating unit (b) include Combinations (PP-1) to (PP-10) shown in Table 1 below, but the invention should not be construed as being limited thereto.

TABLE 1

| No. | Repeating Unit Represented by Formula (1) | Repeating Unit (a) | Repeating Unit (b) |
|---|---|---|---|
| PP-1 | 1-3 | a-1 | b-1 |
| PP-2 | 1-3 | a-1 | b-8 |
| PP-3 | 1-2 | a-1 | b-1 |
| PP-4 | 1-2 | a-1 | b-8 |
| PP-5 | 1-2 | a-1 | b-11 |
| PP-6 | 1-9 | a-5 | b-1 |
| PP-7 | 1-5 | a-3 | b-1 |
| PP-8 | 1-5 | a-3 | b-8 |
| PP-9 | 1-1 | a-3 | b-1 |
| PP-10 | 1-1 | a-5 | b-8 |
| PP-11 | 1-9 | a-3 | b-1 |

In order to maintain the developing property of the photopolymerizable photosensitive layer, it is preferred that the binder polymer used has an adequate molecular weight. The weight average molecular weight of the binder polymer is preferably from 5,000 to 300,000, and more preferably from 20,000 to 150,000.

The binder polymer can be incorporated in an appropriate amount into the photosensitive layer. When the amount of the binder polymer exceeds 90% by weight of the photosensitive layer, the preferable results are not obtained in view of the strength of image formed or the like in some cases. Thus, the amount is preferably from 10 to 90% by weight, and more preferably from 30 to 80% by weight, based on the photosensitive layer.

[Dye or Pigment Capable of Absorbing Light having a Wavelength of a Laser Emission Wavelength ±50 nm]

According to the invention, the photosensitive layer contains a dye or pigment capable of absorbing light having a wavelength of a laser emission wavelength ±50 nm. However, such a dye or pigment is different from the sensitizing dye and does not have the function for transmitting energy to the photopolymerization initiator.

The above-described dye or pigment is not particularly restricted as long as it is a dye or pigment which is capable of absorbing light having a wavelength range of a laser emission wavelength ±50 nm. It is preferably a dye or pigment having an absorption maximum in a wavelength range of a laser emission wavelength ±50 nm, more preferably a dye or pigment having an absorption maximum in a wavelength range of a laser emission wavelength ±20 nm, and still more preferably a dye or pigment having an absorption maximum in the same wavelength as a laser emission wavelength.

The exposure by a blue or violet region laser emitting light of 350 to 450 nm is particularly desirable according to the invention, and as the dye or pigment corresponding to the laser, a yellow dye or pigment is preferably added.

Examples of the yellow dye include yellow acid dyes. Specific examples of the yellow dye include acid dyes described in *Senryo Binran* and a group of C.I. Acid Yellow. Particularly preferable examples thereof include C.I. Acid Yellow 17, C.I. Acid Yellow 19, C.I. Acid Yellow 23, C.I. Acid Yellow 38, C.I. Acid Yellow 42, C.I. Acid Yellow 61, C.I. Acid Yellow 72 and C.I. Acid Yellow 141.

The dyes set forth below are also preferably used.

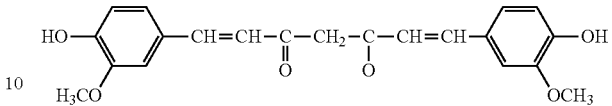

1374F

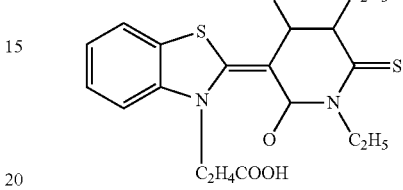

PM1659K

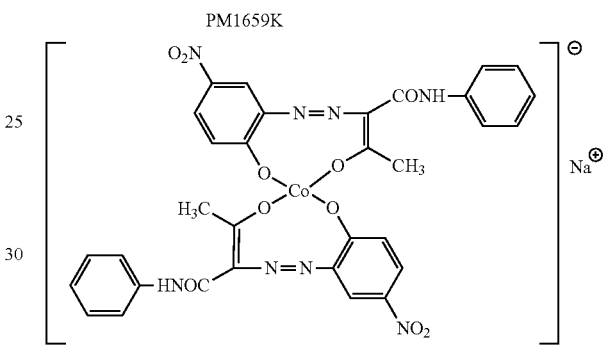

ASY-3RH

[structure]

$R_1$ = H  TAR
$R_1$ = $CH_3$  5-Methyl-4-(2-thiazolylazo)resorcinol

[structure]

$R_2$ = OH  4-Hydroxyazobenzene-2'-carboxylic Acid
$R_2$ = $Net_2$  Ethyl Red

[structure]

Alizarin Yellow GG

[structure]

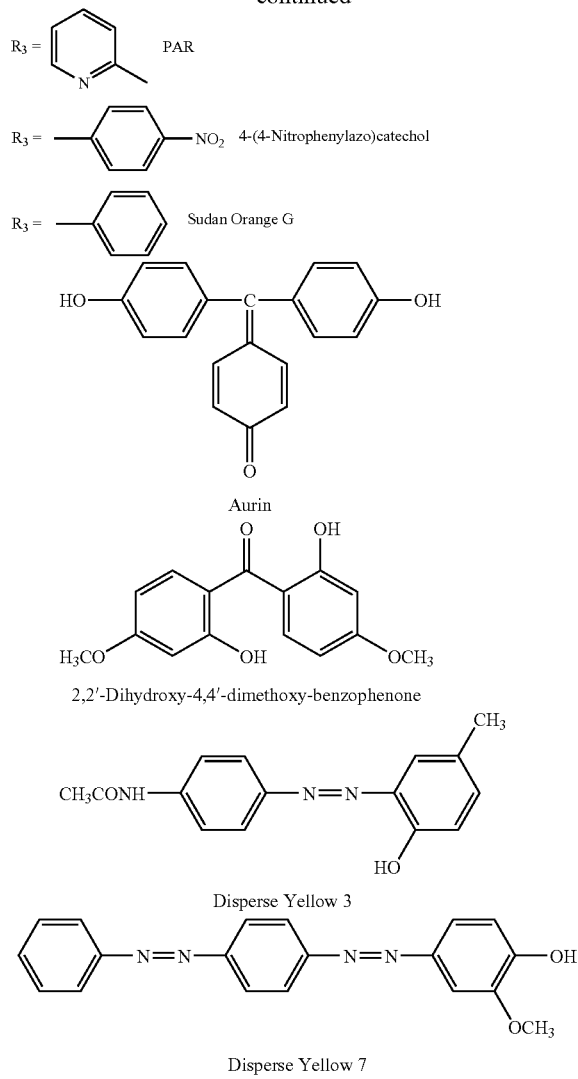

Examples of the yellow pigment include Novoperm Yellow H2G, Seikafast Yellow 2200, Seikafast Yellow 2300, Seikafast Yellow, HOSTACOPY Y501, Yellow master batch, PV Fast Yellow HG, Novoperm Yellow P-HG and Novoperm Yellow M2R.

By using the above-described dye or pigment, the effect for preventing dot filling in the shadow area due to reflected light or scattered light of the laser is achieved and a photopolymerization type photosensitive lithographic printing plate precursor can be provided, which is suitable for high definition AM screen printing or more or FM screen printing, and particularly, which is excellent in uniformity of halftone dot in the halftone area in case of using the FM screen.

The amount of the dye or pigment added to the photosensitive layer is preferably 0.01% by weight or more, more preferably 0.05% by weight or more, based on the weight of the photosensitive layer. Also, from the standpoint of maintaining the amount of light reaching the photosensitive layer and keeping the sensitivity in a preferable range, the amount of the dye or pigment added is preferably 10% by weight or less, more preferably 5% by weight or less.

It is desirable to add a small amount of a thermal polymerization inhibitor to the photosensitive layer for use in the invention in addition to the above-described basic components in order to prevent the addition polymerizable compound having an ethylenically unsaturated double bond from undergoing undesirable thermal polymerization during the production or preservation of the composition (photopolymerization type photosensitive composition) for forming the photosensitive layer. Examples of suitable thermal polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), N-nitrosophenylhydroxyamine cerium(III) salt and N-nitrosophenylhydroxyamine aluminum salt. The amount of the thermal polymerization inhibitor added is preferably from about 0.01 to about 5% by weight based on the total components of the composition. If desired, in order to prevent polymerization inhibition due to oxygen, a higher fatty acid derivative, for example, behenic acid or behenic acid amide may be added and allowed to localize on the surface of the photopolymerization type photosensitive layer during a drying step after the coating. The amount of the higher fatty acid derivative added is preferably from about 0.5 to about 10% by weight based on the total components of the photopolymerization type photosensitive composition.

Further, a coloring agent may be added for the purpose of coloring the photosensitive layer. The coloring agent includes pigments, for example, phthalocyanine-base pigment (e.g., C.I. Pigment Blue 15:3, C.I. Pigment Blue 15:4 or C.I. Pigment Blue 15:6), azo-base pigment, carbon black and titanium oxide, and dyes, for example, Ethyl Violet, Crystal Violet, azo dye, anthraquinone-base dye and cyanine-base dye. The amount of the coloring agent added is preferably from about 0.5 to about 5% by weight based on the total components of the photopolymerization type photosensitive composition.

Moreover, in order to improve physical properties of the cured layer, an additive, for example, inorganic filler or a plasticizer, e.g., dioctyl phthalate, dimethyl phthalate or tricresyl phosphate. The amount of the additive is preferably 10% by weight or less based on the total components of the photopolymerization type photosensitive composition.

Furthermore, to the composition for forming the photosensitive layer can be added a surfactant for improving surface quality of the coating. Preferable examples of the surfactant include a fluorine-based nonionic surfactant.

According to the invention, the photopolymerization type photosensitive composition is provided on a support which is subjected to various surface treatments described in detail hereinbefore, if desired. In the case of providing the photopolymerization type photosensitive composition on a support, the photosensitive composition can be used after dissolving it in various organic solvents. Examples of the solvent capable of being used include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, methyl lactate and ethyl lactate. The solvents may be used individually or as a mixture thereof. The concentration of solid content in the coating solution is appropriately from 1 to 50% by weight.

The coating amount of the photosensitive layer of the photopolymerization type photosensitive lithographic printing plate precursor is preferably in a range of about 0.1 to about 10 g/m$^2$, more preferably in a range of 0.3 to 5 g/m$^2$, and still more preferably in a range of 0.5 to 3 g/m$^2$, in terms of weight after drying.

[Protective Layer]

On the photosensitive layer described above, an oxygen blocking protective layer (overcoat layer) is ordinarily provided in order to avoid polymerization inhibiting function of oxygen.

The coating amount of the protective layer according to the invention is preferably in a range of 0.7 to 3.0 g/m$^2$. When the coating amount is less than 0.7 g/m$^2$, the sensitivity may decrease in some cases, whereas when it exceeds 3.0 g/m$^2$, the burden on treatment process may increase in some cases.

The oxygen blocking protective layer contains a water-soluble vinyl polymer. Examples of the water-soluble vinyl polymer include polyvinyl alcohol, a partial ester, ether or acetal thereof and a copolymer thereof containing a substantial amount of an unsubstituted vinyl alcohol unit necessary for providing the water-solubility. Examples of the polyvinyl alcohol include those which are hydrolyzed to an extent of 71 to 100% and which have a polymerization degree in a range of 300 to 2,400. Specifically, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and L-8, all of which are produced by Kuraray Co., Ltd., are enumerated. The copolymer includes polyvinyl acetate chloroacetate or propionate, polyvinyl formal and polyvinyl acetal each hydrolyzed to an extent of 88 to 100% and copolymers thereof. Other useful polymers include, for example, polyvinyl pyrrolidone, gelatin and gum arabic. The polymers may be used individually or in combination.

In order to obtain the particularly optimal results according to the invention, it is preferred to use polyvinyl alcohol having a hydrolysis extent of 95% or more.

As a solvent used for coating the protective layer in the photosensitive lithographic printing plate precursor according to the invention, although pure water is preferable, a mixture of pure water with an alcohol, for example, methanol or ethanol or a ketone, for example, acetone or methyl ethyl ketone may be used. The concentration of the solid content in the coating solution is appropriately from 1 to 20% by weight. To the protective layer according to the invention may be added known additives, for example, a surfactant for improving coating property or a water-soluble plasticizer for improving physical property of the coated layer. Examples of the water-soluble plasticizer include propionamide, cyclohexanediol, glycerin and sorbitol. Also, a water-soluble (meth) acrylic polymer may be added.

[Plate-making Process]

Now, a plate-making method using the photosensitive lithographic printing plate precursor of the invention is described in detail below. As for the exposure method of the photosensitive lithographic printing plate precursor, an AlGaInN semiconductor laser (commercially available InGaN semiconductor laser: 5 to 30 mW) is preferably used as a light source in view of wavelength characteristics and cost.

The exposure mechanism may be any of internal drum system, external drum system and flat bed system. When the photosensitive layer component of the photosensitive lithographic printing plate precursor according to the invention used has high water solubility, the photosensitive layer can be made soluble in neutral water or alkalescent water, and the photosensitive lithographic printing plate precursor having such a construction can be loaded on a printing machine and then subjected to exposure and development on the machine.

After the imagewise exposure, the entire surface of the photosensitive lithographic printing plate precursor may be heated, if desired, between the exposure and development. By means of the heating, the image forming reaction in the photosensitive layer is accelerated and advantages, for example, improvement in the sensitivity and printing durability and stabilization of the sensitivity are achieved. For the purpose of improving the image strength and printing durability, it is also effective to perform entire after-heating or entire exposure of the image after development. Ordinarily, the heating before development is preferably performed under a mild condition of 150° C. or lower. When the temperature is too high, a problem, for example, in that the non-image area is also fogged may arise. In the heating after development, a very strong condition is utilized. The temperature is ordinarily in a range of 200 to 500° C. When the temperature is too low, the sufficient image-strengthening function can not be obtained, whereas when it is too high, problems, for example, of degradation of the support and thermal decomposition of the image area may arise.

(Developer)

The developer for use in the plate-making method of the lithographic printing plate precursor is not particularly restricted and, for example, a solution containing an inorganic alkali salt and a nonionic surfactant and having a pH of 11.0 to 12.5 is preferably used.

The inorganic alkali salt can be appropriately used. Examples thereof include an inorganic alkali agent, for example, sodium hydroxide, potassium hydroxide, ammonium hydroxide, lithium hydroxide, sodium silicate, potassium silicate, ammonium silicate, lithium silicate, sodium tertiary phosphate, potassium tertiary phosphate, ammonium tertiary phosphate, sodium carbonate, potassium carbonate, ammonium carbonate, sodium hydrogencarbonate, potassium hydrogencarbonate, ammonium hydrogencarbonate, sodium borate, potassium borate and ammonium borate. The inorganic alkali salts may be used individually or in combination of two or more thereof.

In the case of using the silicate, the developing property can be easily adjusted by selecting a mixing ratio of silicon oxide ($SiO_2$) to alkali oxide ($M_2O$ (wherein M represents an alkali metal or an ammonium group)), which are the components of the silicate, and the concentration thereof. Of the aqueous alkali solutions, an aqueous alkali solution having the mixing ratio of silicon oxide ($SiO_2$) to alkali oxide ($M_2O$) ($SiO_2/M_2O$ in molar ratio) of 0.5 to 3.0 is preferred, and that of 1.0 to 2.0 is more preferred. The total amount of the $SiO_2/M_2O$ added is preferably from 1 to 10% by weight, more preferably from 3 to 8% by weight, and most preferably from 4 to 7% by weight, based on the weight of the aqueous alkali solution. When the amount is 1% by weight or more, the developing property and processing ability are not deteriorated whereas, when it is 10% by weight or less, the formation of precipitates and crystals is inhibited and gelation at neutralization of waste liquor of the developer is prevented, thereby causing no troubles in treatment of the waste liquor.

Also, an organic alkali agent may be supplementarily used for the purposes of delicate adjustment of alkali concentration and of assisting dissolution of the photosensitive layer. Examples of the organic alkali agent includes monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine and tetramethylammonium hydroxide. The organic alkali agents may be used individually or in combination of two or more thereof.

The surfactant is appropriately used. Examples thereof include nonionic surfactants, for example, a nonionic surfactant having polyoxyalkylene ether group, a polyoxyethylene alkyl ester (e.g., polyoxyethylene stearate), a sorbitan alkyl ester (e.g., sorbitan monolaurate, sorbitan monostearate, sorbitan distearate, sorbitan monooleate, sorbitan sesquioleate or sorbitan trioleate) and a monoglyceride alkyl ester (e.g., glycerol monostearate or glycerol monooleate); anionic surfactants, for example, an alkylbenzenesulfonate (e.g., sodium dodecylbenzenesulfonate), an alkylnaphthalenesulfonate (e.g., sodium butylnaphthalenesulfonate, sodium pentylnaphthalenesulfonate, sodium hexylnaphthalenesulfonate or sodium octylnaphthalenesulfonate), an alkylsulfate (e.g., sodium laurylsulfate), an alkylsulfonate (e.g., sodium dodecylsulfonate) and a sulfosuccinic acid ester salt (e.g., sodium dilaurylsulfosuccinate); and amphoteric surfactants, for example, an alkylbetaine (e.g., laurylbetaine or stearylbetaine) and an amino acid. Nonionic surfactants having a polyoxyalkylene ether group are particularly preferred.

As the surfactant having a polyoxyalkylene ether group, compounds having the structure represented by formula (1) shown below are preferably used.

$$R40\text{-}O\text{-}(R41\text{-}O)_p H \quad (I)$$

In formula (1), R40 represents an alkyl group having from 3 to 15 carbon atoms which may have a substituent, an aromatic hydrocarbon group having from 6 to 15 carbon atoms which may have a substituent or a heteroaromatic ring group having from 4 to 15 carbon atoms which may have a substituent. Examples of the substituent include an alkyl group having from 1 to 20 carbon atoms, a halogen atom, e.g., Br, Cl or I, an aromatic hydrocarbon group having from 6 to 15 carbon atoms, an aralkyl group having from 7 to 17 carbon atoms, an alkoxy group having from 1 to 20 carbon atoms, an alkoxycarbonyl group having from 2 to 20 carbon atoms and an acyl group having from 2 to 15 carbon atoms. R41 represents an alkylene group having from 1 to 100 carbon atoms which may have a substituent. Examples of the substituent include an alkyl group having from 1 to 20 carbon atoms and an aromatic hydrocarbon group having from 6 to 15 carbon atoms. p represents an integer of 1 to 100.

In the definition of formula (1), specific examples of the "aromatic hydrocarbon group" include a phenyl group, a tolyl group, a naphthyl group, an anthryl group, a biphenyl group and a phenanthryl group, and specific examples of the "heteroaromatic ring group" include a furyl group, a thionyl group, an oxazolyl group, an imidazolyl group, a pyranyl group, a pyridinyl group, an acridinyl group, a benzofuranyl group, a benzothionyl group, a benzopyranyl group, a benzoxazolyl group and a benzimidazolyl group.

Also, the moiety of $(R41\text{-}O)_p$ in formula (1) may comprise two or three kinds of groups to the extent that the above-described definitions are fulfilled. Specifically, there may be illustrated a random or block chain of a combination of ethyleneoxy group and propyleneoxy group, a combination of ethyleneoxy group and isopropyleneoxy group, a combination of ethyleneoxy group and butyleneoxy group, and a combination of ethyleneoxy group and isobutyleneoxy group. In the invention, the surfactants having polyoxyalkylene ether group are used individually or in combination thereof. The surfactant is effectively added in an amount from 1 to 30% by weight, preferably from 2 to 20% by weight, to the developer. When the amount is too small, the developing property may decrease. On the contrary, when it is too large, damage of the development may increase and the printing durability of the resulting printing plate may decrease.

Examples of the nonionic surfactant having polyoxyalkylene ether group represented by formula (1) include a polyoxyethylene alkyl ether, e.g., polyoxyethylene lauryl ether, polyoxyethylene cetyl ether or polyoxyethylene stearyl ether; a polyoxyethylene aryl ether, e.g., polyoxyethylene phenyl ether or polyoxyethylene naphthyl ether; and a polyoxyethylene alkylaryl ether, e.g., polyoxyethylene methylphenyl ether, polyoxyethylene octylphenyl ether or polyoxyethylene nonylphenyl ether.

The surfactants can be used individually or in combination thereof. Also, the amount of the surfactant used in the developer is preferably in a range of 0.1 to 20% by weight in terms of the active ingredient.

The pH of the developer for use in the plate-making of the photosensitive lithographic printing plate precursor according to the invention is not particularly restricted and it is preferably from 11.0 to 12.7, and more preferably from 11.5 to 12.5. When the pH is 11.0 or more, the formation of image is surely performed, whereas when it is 12.7 or less over development is prevented and the exposed area does not suffer the damage due to the development.

Further, the electric conductivity of the developer is preferably from 3 to 30 mS/cm. When the electric conductivity is 3 mS/cm or more, dissolution of the photopolymerization type photosensitive layer on the support surface can be surely conducted to prevent the occurrence of stain at printing, whereas when it is 30 mS/cm or less, since the salt concentration is not too high, a dissolution rate of the photopolymerization type photosensitive layer does not become extremely low, thereby preventing the occurrence of remaining layer in the unexposed area. The electric conductivity is particularly preferably in a range of 5 to 20 mS/cm.

The development of the photosensitive lithographic printing plate precursor according to the invention is conducted at a temperature from 0 to 60° C., preferably from about 15 to about 40° C., in a conventional manner, for example, by immersing the exposed photosensitive lithographic printing plate precursor in the developer and rubbing it with a brush.

Further, in the case of conducting the development processing using an automatic developing machine, since the developer becomes fatigued in accordance with the amount of processing, the processing ability may be restored by using a replenisher or a fresh developer.

The thus development-processed photosensitive lithographic printing plate precursor is subjected to after-treatment with washing water, a rinse solution containing, for example, a surfactant, or an oil-desensitizing solution containing, for example, gum arabic or a starch derivative, as described, for example, in JP-A-54-8002, JP-A-55-115045 and JP-A-59-58431. In the after-treatment of the photosensitive lithographic printing plate precursor according to the invention, these treatments may be used in combination.

The printing plate thus-obtained in accordance with the above-described processing can be improved in the printing durability thereof by conducting an after-exposure treatment according to the method described in JP-A-2000-89478 or a heat treatment, for example, baking.

The lithographic printing plate thus-obtained is mounted on an offset printing machine to use for printing a large number of sheets.

EXAMPLES

The present invention will be described in more detail with reference to the following examples, but the invention should not be construed as being limited thereto.

Examples 1 to 7

Support Example 1

(Support 1: Anodized Aluminum Support)

A 0.30-mm thick aluminum plate of 1S material was grained at the surface thereof using a No. 8 nylon brush and an aqueous suspension containing 800-mesh pumice stone, and then thoroughly washed with water. The plate was immersed in a 10% sodium hydroxide aqueous solution at 70° C. for 60 seconds to etch, followed by washing with running water, neutralizing with 20% $HNO_3$ aqueous solution, and then washing with water. The plate was then subjected to the electrolytic surface roughening treatment in a 1% nitric acid aqueous solution under the condition of VA=12.7 V at an anodic time electricity of 300 Coulomb/$dm^2$ using a current having an alternating sine wave form. The surface roughness was measured and found to be 0.45 μm (in terms of Ra). Subsequently, the plate was immersed in a 30% $H_2SO_4$ aqueous solution to desmut at 55° C. for 2 minutes. Then, the plate was anodized in a 20% $H_2SO_4$ aqueous solution of 33° C. at an electric current of 5 A/$dm^2$ for 50 seconds with disposing a cathode to the grained surface to form an anodic oxide film of 2.6 g/$m^2$ in thickness. The resulting plate was referred to as Support 1.

(Support 2)

An undercoat solution of Polymer (SP1) shown below was coated on Support 1 using a bar coater so as to have a dry coating amount of 2 mg/$m^2$, followed by drying at 80° C. for 20 seconds to prepare Support 2.

| <Undercoat solution> | |
|---|---|
| Polymer (SP1) shown below | 0.3 g |
| Pure water | 60.0 g |
| Methanol | 939.7 g |

Structural Formula of Polymer (SP1):

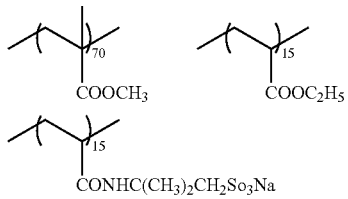

On Support 2 was coated a photosensitive composition having the components shown below using a bar coater, followed by drying at 90° C. for one minute. The weight of photosensitive composition after drying was 1.35 g/$m^2$.

As the binder polymer, PP-3 shown in Table 1 was used. As the sensitizing dye, (D40) shown in the specific examples above was used. As the mercapto group-containing heterocyclic compound, (SH8) shown in the specific examples above was used.

| <Photopolymerization type photosensitive composition> | |
|---|---|
| PLEX 6661-0 (produced by Degussa AG) | 1.69 parts by weight |
| Binder polymer PP-3 | 1.87 parts by weight |
| Sensitizing dye (D40) | 0.13 parts by weight |
| BIMD (hexaarylbisimidazole, produced by Kurogane Kasei Co., Ltd.) | 0.46 parts by weight |
| ε-Phthalocyanine (F1) dispersion (25% MEK dispersion) | 1.70 parts by weight |
| Mercapto group-containing heterocyclic compound (SH8) | 0.34 parts by weight |
| Fluorine-based nonionic surfactant (Megafac F-780F, produced by Dainippon Ink and Chemicals, Inc.) | 0.03 parts by weight |
| Cupferron AL (produced by Wako Pure Chemical Industries, Ltd) (10% tricresyl phosphate solution) | 0.12 parts by weight |
| Methyl ethyl ketone | 27.0 parts by weight |
| Propylene glycol monomethyl ether | 26.7 parts by weight |
| Yellow dye or pigment shown in Table 2 | (parts by weight shown in Table 2) |

In the photopolymerization type photosensitive composition, ε-Phthalocyanine (F1) used is a compound illustrated by the chemical formula shown below. Binder polymer PP3 has a molar ratio of repeating units of 10:14:76 starting from the left and a weight average molecular weight of 90,000. BIMD is a compound illustrated by the chemical formula shown below.

ε-Phthalocyanine (F1):

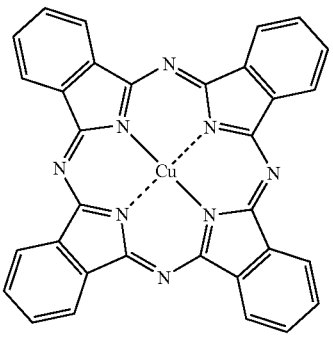

BIMD:

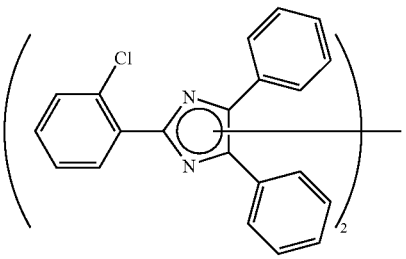

On the photosensitive layer was coated an aqueous solution for protective layer having the composition shown below using a bar coater so as to have a dry coating amount of 2.5 g/m², followed by drying at 120° C. for one minute. Thus, photosensitive lithographic printing plate precursors shown in Table 2 were prepared, respectively.

| | |
|---|---|
| PVA105 (saponification degree: 98% by mole, produced by Kuraray Co., Ltd.) | 1.80 parts by weight |
| Polyvinyl pyrrolidone | 0.40 parts by weight |
| EMALEX 710 (nonionic surfactant, produced by Nihon-Emulsion Co., Ltd.) | 0.04 parts by weight |
| Pionin D230 (produced by Takemoto Oil & Fat Co., Ltd.) | 0.05 parts by weight |
| Luviskol V64W (produced by BASF AG) | 0.06 parts by weight |
| 13% Aqueous solution of sulfonic acid group-containing polymer having structure shown below | 0.36 parts by weight |
| Pure water | 36.0 parts by weight |

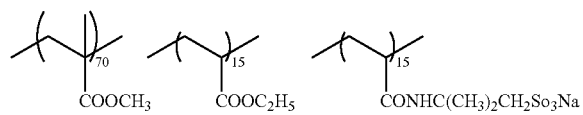

(Evaluation of Unevenness of Halftone Dot)

The photosensitive lithographic printing plate precursor was cut into a piece of 700 mm long and 500 mm wide and loaded in a violet semiconductor laser setter Vx9600 (InGaN semiconductor laser: 405 nm±10 nm emission/output: 30 mW, produced by FUJIFILM Electronic Imaging, Ltd.), and thereon were drawn halftone dots of 35% using an FM screen (TAFFETA 20, produced by Fuji Photo Film Co., Ltd.) in an exposure amount of 90 µJ/cm² and resolution of 2,438 dpi. The exposed photosensitive lithographic printing plate precursor was automatically conveyed to a connecting automatic developing machine (LP1250PLX) (equipped with brushes), and it was heated at 100° C. for 10 seconds, washed with water to remove the protective layer and continuously subjected to development processing at 28° C. for 20 seconds. The developer used was a solution prepared by diluting Developer DV-2 (produced by Fuji Photo Film Co., Ltd.) five times with water. The developed plate was washed with water in a rinse bath and conveyed to a gum coating bath containing a solution prepared by diluting Gum Solution FP-2W (produced by Fuji Photo Film Co., Ltd.) twice with water. After the gum coating, the plate was dried with hot air and discharged to obtain a lithographic printing plate having the halftone dots drawn. An area ratio of the halftone dot of the lithographic printing plate was measured at 24 points at 10 cm horizontal and vertical intervals using CC-dot and an area difference (δ dot) between the maximum value and the minimum value was determined. The results are shown in Table 2 below.

(Evaluation of Spreading of Shadow Area)

The photosensitive lithographic printing plate precursor was cut into five pieces of 700 mm long and 500 mm wide and each of halftone dots of 95% to 99% of AM screen 200 lines was drawn every one % on each of the five pieces, followed by development processing using the same exposure machine and developing machine as described above. The halftone dot images on the lithographic printing plates were observed visually using a loupe of 25 magnifications and a maximum value of the halftone dot percent of the plate wherein the halftone dots are clearly reproduced on the entire surface was determined. The lager the value, the better the reproduction of the shadow area. The results obtained are shown in Table 2.

Comparative Example 1

A lithographic printing plate precursor was prepared in the same manner as in Example 1 except for eliminating Aurin as the yellow dye and evaluated in the same manner as described above. The results obtained are shown in Table 2.

TABLE 2

| | Yellow Dye or Pigment | Absorption Maximum Wavelength (nm) | Amount added | Evaluation of Unevenness of Halftone dot (δ dot) | Evaluation of Spreading of Shadow Area |
|---|---|---|---|---|---|
| Example 1 | Aurin | 459 | 0.05 parts by weight | 2.5 | 98% |
| Example 2 | Disperse Yellow 3 | 367 | 0.05 parts by weight | 2.0 | 98% |
| Example 3 | 4-Hydoxyazobenzene-2'-carboxylic acid | 432 | 0.05 parts by weight | 2.0 | 99% |
| Example 4 | Novoperm Yellow H2G (25% MEK dispersion) | 455 | 0.20 parts by weight | 1.5 | 99% |
| Example 5 | Seikafast Yellow 2200 (25% MEK dispersion) | 388 | 0.20 parts by weight | 2.0 | 98% |
| Example 6 | Seikafast Yellow 2400B (25% MEK dispersion) | 372 | 0.20 parts by weight | 1.5 | 98% |
| Example 7 | HOSTACOPY Y501 (25% MEK dispersion) | 440 | 0.20 parts by weight | 2.0 | 99% |
| Comparative Example 1 | None | — | — | 6.5 | 95% |

From the results shown in Table 2, it can be seen that by the addition of yellow dye or pigment to the photosensitive layer, the unevenness of halftone dot and spreading of shadow area are restrained and the influence of leak light, for example, flare light is suppressed.

This application is based on Japanese Patent application JP 2006-268603, filed Sep. 29, 2006, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A negative-working photopolymerization type photosensitive lithographic printing plate precursor for exposing with laser, comprising:
   a hydrophilic support;
   at least one photopolymerizable photosensitive layer; and
   a protective layer, provided in this order,
   wherein the photopolymerizable photosensitive layer comprises a sensitizing dye, a yellow dye or pigment, which is different from the sensitizing dye; and a photopolymerization initiator; and
   wherein said yellow dye or pigment is capable of absorbing light within the wavelength range of ±50 nm of a wavelength of a laser emission, wherein the laser is a laser of blue to ultraviolet region emitting light within the wavelength range of 350 to 450 nm.

2. The negative-working photopolymerization type photosensitive lithographic printing plate precursor as claimed in claim 1, wherein the photosensitive layer comprises:
   a sensitizing dye having an absorption maximum in a wavelength range of from 350 to 450 nm;
   a photopolymerization initiator;
   an addition polymerizable compound having an ethylenically unsaturated double bond;
   a yellow dye or pigment; and
   a binder polymer which is a polymer comprising at least one repeating unit represented by the following formula (1):

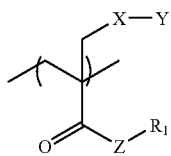

(1)

wherein X represents an oxygen atom, a sulfur atom or a —NH— group, Y represents a hydrogen atom, an alkyl group having from 1 to 12 carbon atoms, a cyclic alkyl group having from 5 to 12 carbon atoms or a group including an aromatic ring having from 6 to 20 carbon atoms, Z represents an oxygen atom, a sulfur atom or a —NH— group, and $R_1$ represents an alkyl group having from 1 to 18 carbon atoms, an alkyl group including an alicyclic structure having from 5 to 20 carbon atoms or a group containing an aromatic ring having from 6 to 20 carbon atoms.

3. The negative-working photopolymerization type photosensitive lithographic printing plate precursor as claimed in claim 2, wherein the photopolymerization initiator is a hexaarylbisimidazole compound and the photosensitive layer further comprises a sulfur-containing compound represented by the following formula (2) or (3):

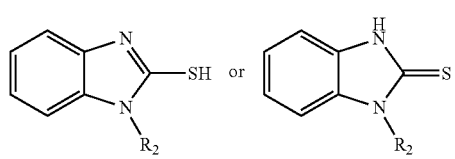

(2)

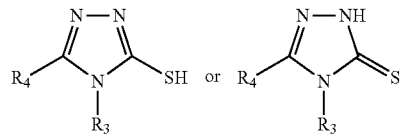

(3)

wherein $R_2$, $R_3$ and $R_4$ each independently represents a hydrogen atom, a substituted or unsubstituted, straight-chain or branched alkyl group having from 1 to 18 carbon atoms, a substituted or unsubstituted cyclic alkyl group having from 5 to 20 carbon atoms or an aromatic group.

4. The negative-working photopolymerization type photosensitive lithographic printing plate precursor as claimed in claim 3, wherein the sulfur-containing compound is a compound represented by one of the following formulae (SH1) to (SH20):

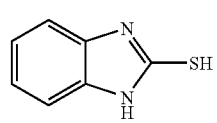

(SH1)

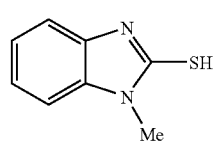

(SH2)

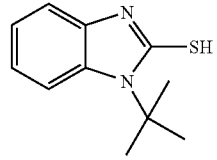

(SH3)

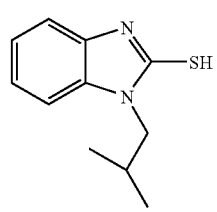

(SH4)

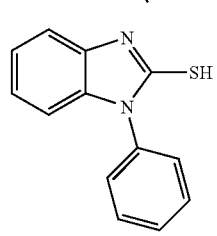

(SH5)

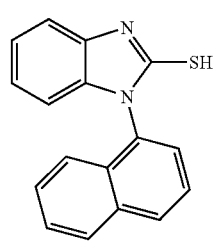

(SH6)

-continued
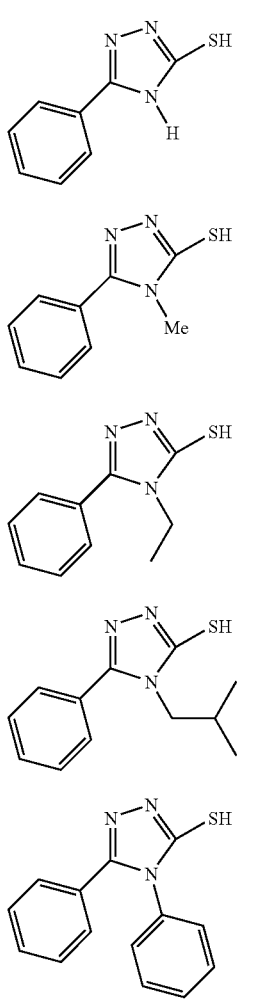
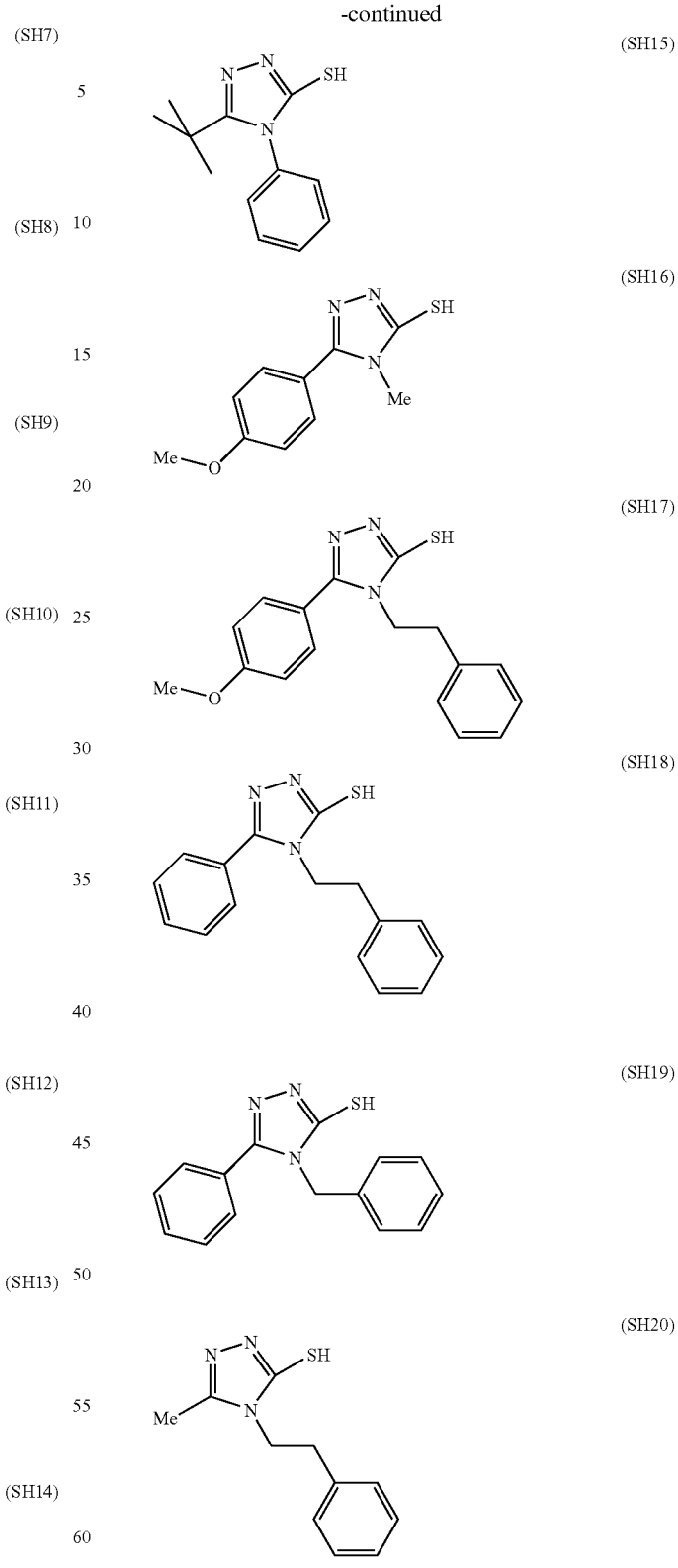
5. The negative-working photopolymerization type photosensitive lithographic printing plate precursor according to claim 1, wherein the photosensitive layer further comprises a coloring agent.

6. The negative-working photopolymerization type photosensitive lithographic printing plate precursor according to claim 5, wherein the coloring agent is 0.01 to 10% by weight based on a weight of the photosensitive layer.

7. The negative-working photopolymerization type photosensitive lithographic printing plate precursor according to claim 5, wherein the yellow dye or pigment absorbs light corresponding a wavelength range of the laser for exposing the printing plate precursor.

* * * * *